United States Patent
Kim et al.

(10) Patent No.: US 11,362,187 B2
(45) Date of Patent: Jun. 14, 2022

(54) SEMICONDUCTOR DEVICES INCLUDING CAPPING LAYER

(71) Applicant: Samsung Electronics Co., Ltd., Suwon-si (KR)

(72) Inventors: Juyoun Kim, Suwon-si (KR); Jinwoo Kim, Hwaseong-si (KR); Kyuman Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/950,104

(22) Filed: Nov. 17, 2020

(65) Prior Publication Data
US 2021/0408254 A1 Dec. 30, 2021

(30) Foreign Application Priority Data
Jun. 24, 2020 (KR) .................. 10-2020-0077143

(51) Int. Cl.
| | | |
|---|---|---|
| *H01L 29/76* | (2006.01) | |
| *H01L 29/94* | (2006.01) | |
| *H01L 31/113* | (2006.01) | |
| *H01L 29/423* | (2006.01) | |
| *H01L 29/66* | (2006.01) | |
| *H01L 29/06* | (2006.01) | |

(52) U.S. Cl.
CPC .... *H01L 29/42364* (2013.01); *H01L 29/0649* (2013.01); *H01L 29/66545* (2013.01)

(58) Field of Classification Search
CPC ........... H01L 29/42364; H01L 29/0649; H01L 29/66545; H01L 29/0847; H01L 21/28123; H01L 29/42376; H01L 29/78

USPC ......................................................... 257/288
See application file for complete search history.

(56) References Cited

U.S. PATENT DOCUMENTS

| | | |
|---|---|---|
| 4,016,476 A | 4/1977 | Morokawa et al. |
| 4,074,351 A | 2/1978 | Boone et al. |
| 4,080,600 A | 3/1978 | Toman |
| 4,114,049 A | 9/1978 | Suzuki |
| 4,168,459 A | 9/1979 | Roesel, Jr. |
| 4,169,990 A | 10/1979 | Lerdman |
| 4,201,976 A | 5/1980 | Patel |
| 4,255,789 A | 3/1981 | Hartford et al. |
| 4,412,285 A | 10/1983 | Neches et al. |
| 4,486,739 A | 12/1984 | Franaszek et al. |
| 4,514,694 A | 4/1985 | Finger |

(Continued)

*Primary Examiner* — Theresa T Doan
(74) *Attorney, Agent, or Firm* — Harness, Dickey & Pierce, P.L.C.

(57) ABSTRACT

A semiconductor device includes first and second active regions on a substrate, an element isolation layer between the first and second active regions, a dummy gate line, dummy gate spacers at opposite side walls of the dummy gate line, and a dummy gate capping layer on the dummy gate line and. An upper surface of the element isolation layer is proximate to an upper surface of the substrate in relation to an upper end of the first active region in a vertical direction. The dummy gate line includes a horizontal section extending on the first active region to the element isolation layer in a horizontal direction, and a vertical section extending downwards from the horizontal section along a side wall of the first active region, the dummy gate line having an L shape, a vertical thickness of the horizontal section being smaller than a vertical thickness of the vertical section.

20 Claims, 20 Drawing Sheets

(56) References Cited

U.S. PATENT DOCUMENTS

| | | | |
|---|---|---|---|
| 4,540,921 A | 9/1985 | Boyd, Jr. et al. |
| 4,706,133 A | 11/1987 | Giddings |
| 4,709,293 A | 11/1987 | Gershen et al. |
| 4,721,853 A | 1/1988 | Wraight |
| 4,750,036 A | 6/1988 | Martinez |
| 4,761,768 A | 8/1988 | Turner et al. |
| 4,841,925 A | 6/1989 | Ward |
| 4,860,290 A | 8/1989 | Daniels et al. |
| 4,959,812 A | 9/1990 | Momodomi et al. |
| 4,985,832 A | 1/1991 | Grondalski |
| 5,128,984 A | 7/1992 | Katz |
| 5,270,979 A | 12/1993 | Harari et al. |
| 5,342,034 A | 8/1994 | Mandel et al. |
| 5,477,165 A | 12/1995 | ElAyat et al. |
| 5,481,553 A | 1/1996 | Suzuki et al. |
| 5,491,804 A | 2/1996 | Heath et al. |
| 5,583,457 A | 12/1996 | Horiguchi et al. |
| 5,783,956 A | 7/1998 | Ooishi |
| 5,892,900 A | 4/1999 | Ginter et al. |
| 5,976,259 A | 11/1999 | Yamazaki |
| 6,081,757 A | 6/2000 | Breed et al. |
| 6,289,306 B1 | 9/2001 | Van Der Vleuten et al. |
| 6,297,627 B1 | 10/2001 | Towne et al. |
| 6,388,533 B2 | 5/2002 | Swoboda |
| 6,403,943 B2 | 6/2002 | Wada et al. |
| 6,583,972 B2 | 6/2003 | Verhaege et al. |
| 6,618,048 B1 | 9/2003 | Leather |
| 6,624,699 B2 | 9/2003 | Yin et al. |
| 6,630,885 B2 | 10/2003 | Hardman et al. |
| 6,690,347 B2 | 2/2004 | Jeon et al. |
| 6,695,936 B2 | 2/2004 | Johnson |
| 6,798,148 B2 | 9/2004 | Inukai |
| 6,825,644 B2 | 11/2004 | Kernahan et al. |
| 6,855,929 B2 | 2/2005 | Kimba et al. |
| 6,856,546 B2 | 2/2005 | Guterman et al. |
| 6,867,638 B2 | 3/2005 | Saiki et al. |
| 6,998,722 B2 | 2/2006 | Madurawe |
| 7,053,009 B2 | 5/2006 | Conley, Jr. et al. |
| 7,053,890 B2 | 5/2006 | Inukai |
| 7,084,666 B2 | 8/2006 | Madurawe |
| 7,106,292 B2 | 9/2006 | Moon |
| 7,153,454 B2 | 12/2006 | Khoshnevis |
| 7,161,476 B2 | 1/2007 | Hardman et al. |
| 7,170,802 B2 | 1/2007 | Cernea et al. |
| 7,358,806 B2 | 4/2008 | Burns et al. |
| 7,403,424 B2 | 7/2008 | Hemink et al. |
| 7,408,804 B2 | 8/2008 | Hemink et al. |
| 7,486,564 B2 | 2/2009 | Hemink et al. |
| 7,733,659 B2 | 6/2010 | Snider et al. |
| 7,761,800 B2 | 7/2010 | Chaudhri et al. |
| 7,986,042 B2 | 7/2011 | Or-Bach et al. |
| 8,079,983 B2 | 12/2011 | Rush et al. |
| 8,250,271 B2 | 8/2012 | Swing et al. |
| 8,299,494 B2 | 10/2012 | Yilmaz et al. |
| 8,313,639 B2 | 11/2012 | Rothberg et al. |
| 8,626,223 B2 | 1/2014 | Brisebois et al. |
| 8,680,625 B2 * | 3/2014 | Fan ................ H01L 29/7848 257/401 |
| 8,759,872 B2 | 6/2014 | Arghavani et al. |
| 8,779,493 B2 | 7/2014 | Cho |
| 8,838,135 B2 | 9/2014 | Moshfeghi |
| 8,971,124 B1 | 3/2015 | Manning |
| 9,059,090 B2 * | 6/2015 | Kim ................ H01L 21/823462 |
| 9,160,287 B2 | 10/2015 | Briffa et al. |
| 9,219,445 B2 | 12/2015 | Nobbe et al. |
| 9,340,353 B2 | 5/2016 | Oren et al. |
| 9,413,298 B2 | 8/2016 | Nobbe et al. |
| 9,443,097 B2 | 9/2016 | O'Hare et al. |
| 9,483,610 B2 | 11/2016 | McMillen et al. |
| 9,716,477 B2 | 7/2017 | Wagh et al. |
| 9,730,105 B2 | 8/2017 | Bhushan et al. |
| 9,862,551 B2 | 1/2018 | Oren et al. |
| 9,969,564 B2 | 5/2018 | Oren et al. |
| 10,032,886 B2 | 7/2018 | Chung et al. |
| 10,128,241 B2 | 11/2018 | Kim et al. |
| 10,154,437 B2 | 12/2018 | Bhushan et al. |
| 10,211,103 B1 | 2/2019 | Huang et al. |
| 10,243,059 B2 | 3/2019 | Samavedan et al. |
| 10,249,379 B2 | 4/2019 | Chung |
| 10,314,077 B2 | 6/2019 | Bhushan et al. |
| 2017/0040318 A1 | 2/2017 | Hung et al. |
| 2019/0115349 A1 | 4/2019 | Liaw |
| 2019/0326158 A1 | 10/2019 | Chung et al. |
| 2019/0355719 A1 | 11/2019 | Maeda et al. |

\* cited by examiner

SEMICONDUCTOR DEVICES INCLUDING CAPPING LAYER

CROSS-REFERENCE TO THE RELATED APPLICATION

This application claims priority, under 35 U.S.C. § 119, from Korean Patent Application No. 10-2020-0077143, filed on Jun. 24, 2020, in the Korean Intellectual Property Office, the disclosure of which is incorporated herein by reference in its entirety.

BACKGROUND

1. Field

Some example embodiments of the inventive concepts relate to semiconductor devices including a capping layer and methods for manufacturing the same.

2. Description of the Related Art

In accordance with advance of electronic technologies, down-scaling of integrated circuit devices is rapidly progressing. Highly integrated circuit devices not only require a high operation speed, but also accuracy associated with operation.

SUMMARY

Some example embodiments of the inventive concepts provide a semiconductor device wherein a gate line, which is on a fin and an element isolation layer, has reliability without being electrically short-circuited with contacts therearound even when the gate line is inclined. Accordingly, an integrated circuit device having a structure capable of stably securing an insulation distance between lines and contacts in a relatively small area is provided. In some example embodiments, methods for embodying the integrated circuit device may be provided.

A semiconductor device according to some example embodiments of the inventive concepts may include a first active region and a second active region on a substrate and an element isolation layer between the first active region and the second active region. An upper surface of the element isolation layer may be proximate to an upper surface of the substrate in relation to an upper end of the first active region in a vertical direction extending perpendicular to the upper surface of the substrate. The semiconductor device may include a first dummy gate line including a horizontal section extending at least partially on the first active region to the element isolation layer in a horizontal direction extending parallel to the upper surface of the substrate, and a vertical section extending from the horizontal section and towards the upper surface of the substrate in the vertical direction along a side wall of the first active region, the first dummy gate line having an L shape. The semiconductor device may include first dummy gate spacers at opposite side walls of the first dummy gate line, respectively, and a first dummy gate capping layer on both the first dummy gate line and the first dummy gate spacers. A thickness of the horizontal section in the vertical direction may be smaller than a thickness of the vertical section in the vertical direction. Accordingly, an integrated circuit device having a structure capable of stably securing an insulation distance between lines and contacts in a relatively small area is provided. In some example embodiments, methods for embodying the integrated circuit device may be provided.

A semiconductor device according to some example embodiments of the inventive concepts may include a first active region and a second active region on a substrate, and an element isolation layer between the first active region and the second active region. An upper surface of the element isolation layer may be proximate to an upper surface of the substrate in relation to an upper end of the second active region in a vertical direction extending perpendicular to the upper surface of the substrate. The semiconductor device may include a gate structure including a gate line on the first active region, gate spacers at opposite side walls of the gate line, and a gate capping layer on both the gate line and the gate spacers. The semiconductor device may include a dummy gate structure including a dummy gate line on both the first active region and the element isolation layer while having an L shape, dummy gate spacers at opposite side walls of the dummy gate line, respectively, and a dummy gate capping layer on both the dummy gate line and the dummy gate spacers. The dummy gate structure may be inclined toward the gate structure, and a lower surface of the dummy gate capping layer may be proximate to the upper surface of the substrate in relation to a lower surface of the gate capping layer in the vertical direction. Accordingly, an integrated circuit device having a structure capable of stably securing an insulation distance between lines and contacts in a relatively small area is provided. In some example embodiments, methods for embodying the integrated circuit device may be provided.

A semiconductor device according to some example embodiments of the inventive concepts may include a first active region and a second active region on a substrate, and an element isolation layer between the first active region and the second active region. An upper surface of the element isolation layer may be proximate to an upper surface of the substrate in relation to an upper end of the first active region in a vertical direction extending perpendicular to the upper surface of the substrate. The semiconductor device may include a dummy gate line on both the first active region and the element isolation layer while having an L shape. The semiconductor device may include a dummy gate spacer including a first spacer at one side wall of the dummy gate line on the first active region, and a second spacer at an opposite side wall of the dummy gate line on the element isolation layer. The semiconductor device may include a dummy gate capping layer on both the dummy gate line and the dummy gate spacer. An upper end of the second spacer may be distal to the upper surface of the substrate in relation to an upper end of the first spacer in the vertical direction. Accordingly, an integrated circuit device having a structure capable of stably securing an insulation distance between lines and contacts in a relatively small area is provided. In some example embodiments, methods for embodying the integrated circuit device may be provided.

DETAILED DESCRIPTION

Figure 1:
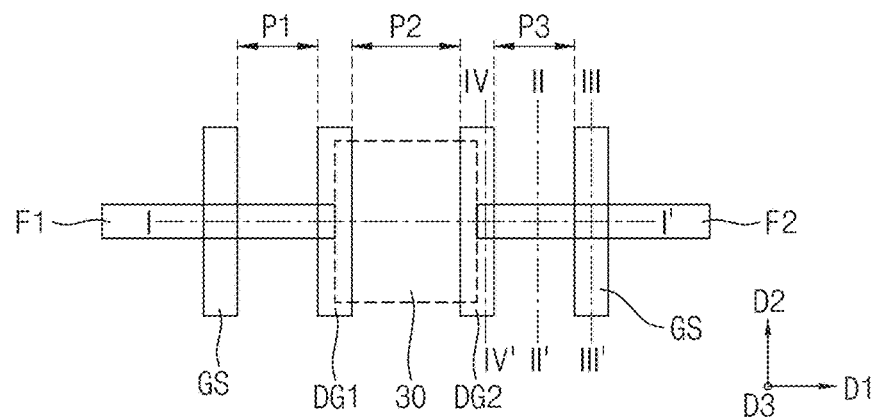
FIG. 1 is a view schematically illustrating a layout of a semiconductor device according to some example embodiments of the inventive concepts.
Figure 2A:
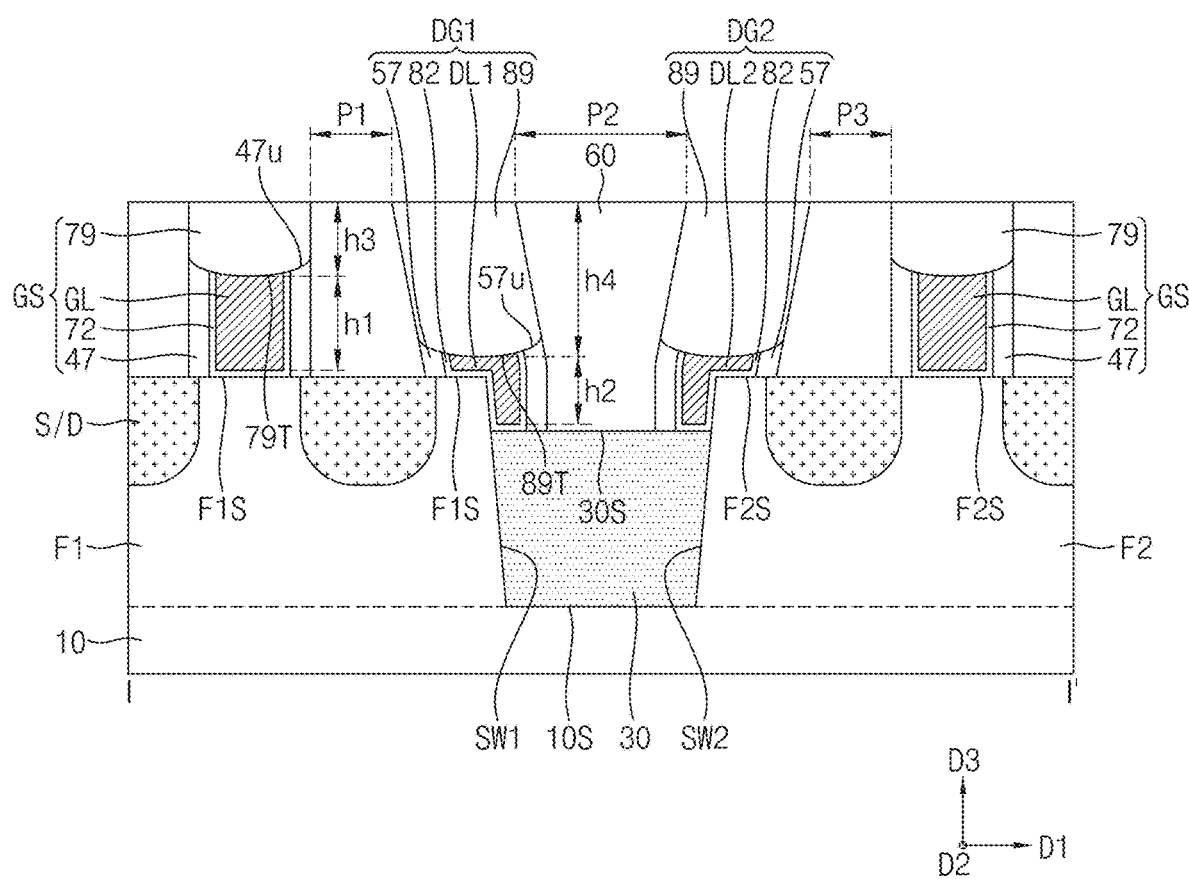
FIG. 2A is a cross-sectional view taken along line I-I' in FIG. 1.
Figure 2B:
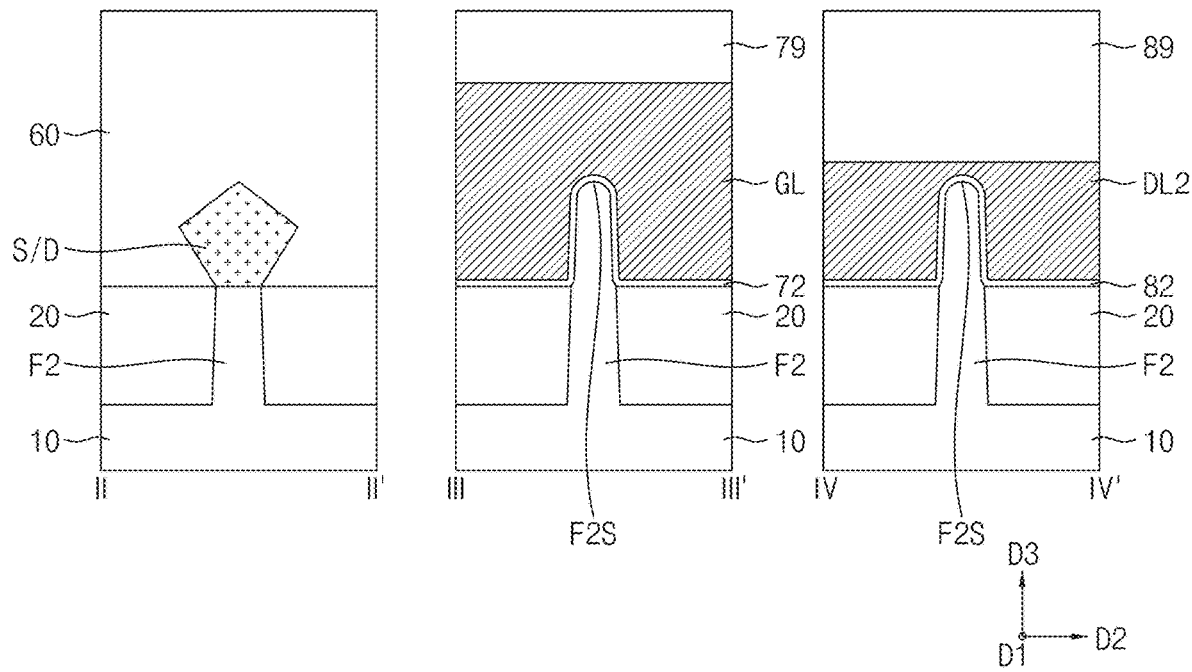
FIG. 2B shows cross-sectional views respectively taken along lines II-II', III III' and IV-IV' in FIG. 1.

FIG. 1 is a view schematically illustrating a layout of a semiconductor device according to some example embodiments of the inventive concepts. FIG. 2A is a cross-sectional view taken along line I-I' in FIG. 1. FIG. 2B shows cross-sectional views respectively taken along lines II-II', III-III' and IV-IV' in FIG. 1.

Referring to FIGS. 1, 2A and 2B, the semiconductor device may include a substrate 10, active regions F1 and F2, a field insulating layer 20, an element isolation layer 30, gate structures GS, dummy gate structures GS1 and GS2, sources/drains S/D, and an interlayer insulating layer 60.

The substrate 10 may be bulk silicon or silicon-on-insulator (SOI). The substrate 10 may include a group IV semiconductor such as Si or Ge, a group IV-IV compound semiconductor such as SiGe or SiC, or a group III-V compound semiconductor such as GaAs, InAs, or InP. In some example embodiments, the substrate 10 may be formed to have a structure in which an epitaxial layer is formed on a base substrate. The substrate 10 may include a conductive region, for example, a well doped with an impurity, or a structure doped with an impurity.

It will be understood that an element that is described herein to be "on" another element may be directly on the other element or indirectly on the other element. An element that is directly on another element will be understood to be in direct contact with the other element. An element that is indirectly on another element will be understood to be isolated from direct contact with the other element by one or more interposing spaces and/or structures. Additionally, it will be understood that an element that is described herein to be "on" another element may be "above" or "beneath" the other element.

The active regions F1 and F2 may protrude from an upper surface 10S of the substrate 10 and thus may be referred to as being "on" (e.g., directly on) the substrate 10. The active regions F1 and F2 may include a first active region F1 and a second active region F2. Each of the first active region F1 and the second active region F2 may extend lengthily in a first direction D1 (e.g., such that the respective lengths of the first and second active regions F1 and F2 extend in the first direction D1). The first active region F1 and the second active region F2 are spaced apart from each other in the first direction D1 while being disposed on the same line. Accordingly, one side wall SW1 of the first active region F1 and one side wall SW2 of the second active region F2 may face each other.

The first active region F1 and the second active region F2 may include silicon or germanium. The first active region F1 and the second active region F2 may include a compound semiconductor, and may include, for example, a group IV-IV compound semiconductor or a group III-V compound semiconductor. In detail, the group IV-IV compound semiconductor may be a binary compound or a ternary compound, which includes at least two of C, Si, Ge, and Sn, or a compound in which the binary compound or the ternary compound is doped with a group IV element. The group III-V compound semiconductor may be one of a binary compound, a ternary compound or a quaternary compound, which is formed through coupling of at least one of Al, Ga or In as group III elements with one of P, As or Sb as group V elements.

The field insulating layer 20 may be disposed on the substrate 10, and may cover lower portions of side walls in each of the first active region F1 and the second active region F2. The level of an upper surface of the field insulating layer 20 may be lower than levels of upper ends of the first active region F1 and the second active region F2. For example, the field insulating layer 20 may include an oxide, a nitride, an oxynitride, or at least one thereof.

The element isolation layer 30 may be disposed (e.g., located) between the first active region F1 and the second active region F2 (e.g., between the first active region F1 and the second active region F2 in the first direction D1 and being at least partially at a same distance from the substrate 10 as the first and second active regions F1 and F2 in the third direction D3). The element isolation layer 30 may contact one side wall SW1 of the first active region F1, and may contact one side wall SW2 of the second active region F2 facing the side wall SW1 of the first active region F1. An upper surface 30S of the element isolation layer 30 may be disposed (e.g., located) at a lower level than respective upper ends F1S and F2S of the first active region F1 and the second active region F2, said upper ends F1S and F2S being the portions of the respective first and second active regions F1 and F2 that have a highest level (e.g., are the furthest portions of the respective first and second active regions F1 and F2 from the upper surface 10S in the third direction).

It will be understood that a "level" of a surface, end, or the like as described herein, may refer to a distance of the given surface, end, or the like in the third direction D3 from the upper surface 10S of the substrate 10, where the third direction D3 (also referred to herein as a vertical direction) extends perpendicular to the upper surface 10S. Accordingly, a surface having a "lower level" than another surface or end will be understood to be closer to the upper surface 10S in the third direction D3 than the other surface or end. For example, as shown in FIGS. 2A-2B, the upper ends F1S and F2S include upper surfaces of respective portions of the first and second active regions F1 and F2 that have a greatest distance in the third direction D3 from the upper surface 10S, out of the entire upper surfaces of the first and second active regions F1 and F2, and thus the upper ends F1S and F2S may be understood to be the highest-level upper surfaces of the respective first and second active regions F1 and F2. Additionally, the upper surface 30S of the element isolation layer 30 is closer (proximate) to the upper surface 10S in the third direction D3 than the upper ends F1S and F2S of the first active region F1 and the second active region F2 and thus the upper surface 30S of the element isolation layer 30 will be understood to have, or be at, a lower level than the upper ends F1S and F2S of the first active region F1 and the second active region F2.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

Further, regardless of whether elements and/or properties thereof (e.g., structures, surfaces, directions, or the like) are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The element isolation layer 30 may extend in a second direction D2, and may also contact the field insulating layer 20. For example, the element isolation layer 30 may include oxide, nitride, oxynitride, or at least one thereof.

Each of the gate structures GS may extend in the second direction D2, and may cross the first active region F1 or the second active region F2. Each of the gate structures GS may be disposed (e.g., located) on (e.g., directly or indirectly on) the first active region F1 or the second active region F2. In addition, the gate structures GS may be disposed on the element isolation layer 30. Each of the gate structures GS may include a gate line GL, a gate dielectric layer 72, a gate spacer 47, and a gate capping layer 79.

The gate line GL may extend in the second direction D2 on the field insulating layer 20 and the active region F1 or F2. In some example embodiments, including the example embodiments shown in FIG. 2A, a gate line GL may be on a first active region F1 or the second active region F2. The gate line GL may have a structure in which a metal nitride layer, a metal layer, a conductive capping layer, and a gap-fill metal film are sequentially stacked. Each of the metal nitride layer and the metal layer may include at least one metal of Ti, Ta, W, Ru, Nb, Mo, or Hf. Each of the metal layer and the metal nitride layer may be formed through an atomic layer deposition (ALD) process, a metal organic ALD process, or a metal organic chemical vapor deposition (MOCVD) process. The conductive capping layer may perform a passivation film function for preventing a surface of the metal layer from being oxidized. In addition, the conductive capping layer may perform a wetting layer function for achieving easy deposition when another conductive layer is deposited on the metal layer. The conductive capping layer may be made of, for example, TiN, TaN, or a combination thereof. The gap-fill metal film may extend over the conductive capping layer. The gap-fill metal film may be constituted by a W film or a TiN film. The gap-fill metal film may be formed through an atomic layer deposition (ALD) process, a chemical vapor deposition (CVD) process, or a physical vapor deposition (PVD) process. The gap-fill metal film may be buried in a recessed space formed by a step on an upper surface of the conductive capping layer without a void.

The gate spacer 47 is disposed on, or at, opposite side walls of the gate line GL, and may extend in the second direction D2. Restated, the gate spacer 47 may include gate spacers at opposite side walls of the gate line GL, for example as shown in FIG. 2A. The gate spacer 47 may have a multilayer structure. The gate spacer 47 may include at least one of oxide, nitride, or oxynitride. The gate spacer 47 may include a low dielectric film.

The gate dielectric layer 72 may be interposed between the gate line GL and the gate spacer 47. In addition, the gate dielectric layer 72 may be interposed between the active region F1 or F2 and the gate line GL while being interposed between the element isolation layer 30 and the gate line GL. For example, the gate dielectric layer 72 may include oxide, nitride, or a high dielectric material. The high dielectric material may mean a dielectric material having a higher dielectric constant than silicon oxide. Although not shown, an interface layer may be interposed between the gate dielectric layer 72 and the active region F1 or F2. The interface layer may include a dielectric material. For example, the interface layer may include at least one of silicon oxide or silicon oxynitride.

The gate capping layer 79 may be disposed on the gate line GL, the gate spacer 47 and the gate dielectric layer 72. A lower surface of the gate capping layer 79 may be a downwardly-convex curved surface. For example, the gate capping layer 79 may include at least one of silicon oxide, silicon nitride or silicon oxynitride. In some example embodiments, the gate dielectric layer 72 may be absent, and the gate capping layer 79 may be on both the gate line GL and the gate spacer 47.

The dummy gate structures DG1 and DG2 may be disposed on the active areas F1 and F2 and the element isolation layer 30. That is, portions of the dummy gate structures DG1 and DG2 may be disposed on the active regions F1 and F2, and other portions of the dummy gate structures DG1 and DG2 may be disposed on the element isolation layer 30. The dummy gate structures DG1 and DG2 may be inclined in the first direction D1. In some example embodiments, the dummy gate structure DG2 and elements thereof may be omitted.

The dummy gate structures DG1 and DG2 may include a first dummy gate structure DG1 disposed on the first active region F1 and the element isolation layer 30, and a second dummy gate structure DG2 disposed on the second active region F2 and the element isolation layer 30. At least one of the first dummy gate structure DG1 or the second dummy gate structure DG2 may be inclined in the first direction D1. In some example embodiments, the first dummy gate structure DG1 and the second dummy gate structure DG2 may be inclined in directions away from each other, respectively (e.g., may be inclined in opposite directions). For example, the first dummy gate structure DG1 may be inclined toward the gate structure GS disposed on the first active region F1, whereas the second dummy gate structure DG2 may be inclined toward the gate structure GS disposed on the second active region F2. Accordingly, a distance P1 between an upper end of the gate structure GS disposed on the first active region F1 and an upper end of the first dummy gate structure DG1 may be smaller than a distance P2 between the upper end of the first dummy gate structure DG1 and an upper end of the second dummy gate structure DG2. In addition, a distance P3 between an upper end of the gate structure GS disposed on the second active region F2 and the upper end of the second dummy gate structure DG2 may be smaller than the distance P2 between the upper end of the first dummy gate structure DG1 and the upper end of the second dummy gate structure DG2. It will be understood, as described herein, that an "upper end" of a structure may refer to the highest portion (e.g., the portion most distal from the upper surface 10S in the third direction D3) of that given structure.

The first dummy gate structure DG1 may include a first dummy gate line DL1, a first dummy gate dielectric layer 82, a first dummy gate spacer 57, and a first dummy gate capping layer 89. As shown in at least FIG. 2A, the dummy gate line DL1 may be on both the first active region F1 and the element isolation layer 30 while having an L shape. As shown in at least FIG. 2A, the first dummy gate spacer 57 may include dummy gate spacers (e.g., 57a and 57b) at opposite side walls of the dummy gate line DL1. As shown in at least FIG. 2A, the dummy gate capping layer 89 may be on both the dummy gate line and the dummy gate spacers (e.g., 57a and 57b). In some example embodiments, the first dummy gate dielectric layer 82 may be absent from the first dummy gate structure DG1.

One portion of the first dummy gate line DL1 may be disposed on the first active region F1, and the other portion of the first dummy gate line DL1 may be disposed on the element isolation layer 30. The first dummy gate line DL1 may extend in the second direction D2. In some example embodiments, the first dummy gate line DL1 may have a structure in which a metal nitride layer, a metal layer and a conductive capping layer are sequentially stacked. Each of the metal nitride layer and the metal layer may include at least one metal selected from Ti, Ta, W, Ru, Nb, Mo, and Hf. The conductive capping layer may include at least one of metal nitrides, for example, TiN and/or TaN.

The cross-section of the first dummy gate line DL1 may have an L shape. In some example embodiments, a height h2 (e.g., thickness in the third direction D3) of the first dummy gate line DL1 may be smaller than a height h1 (e.g., thickness in the third direction D3) of the gate line GL. Here, the height h2 of the first dummy gate line DL1 may mean a minimum distance from a lower surface of the first dummy gate line DL1 disposed at a lowest level (e.g., the lower surface of the first dummy gate line DL1 that is closest, or proximate, to the upper surface 10S of the substrate 10) to the first dummy gate capping layer 89 in the third direction D3 (e.g., the vertical direction). Restated, the height h2 of the first dummy gate line DL1 may mean a minimum, or smallest, thickness in the third direction D3) of the first dummy gate line DL1, and the height h1 of the gate line GL may mean a minimum, or smallest, thickness in the third direction D3) of the gate line GL. Accordingly, the minimum thickness of the first dummy gate line DL1 in the third direction D3 may be smaller than the minimum thickness of the gate line GL in the third direction. In addition, the height h1 of the gate line GL may mean a minimum distance from a lower surface of the gate line GL to the gate capping layer 79.

The first dummy gate spacer 57 may be disposed on, or at, opposite side walls of the first dummy gate line DL1, and may extend in the second direction D2. The first dummy gate spacer 57 may have a multilayer structure. The first dummy gate spacer 57 may include at least one of oxide, nitride or oxynitride. The first dummy gate spacer 57 may include a low dielectric film. The first dummy gate spacer 57 may be made of the same materials as the gate spacer 47. As shown in at least FIG. 2A, upper ends 57u of the first dummy gate spacer 57 (e.g., the upper ends 57u of the first and second spacers 57a and 57b) may be at a lower level (e.g., proximate to the upper surface 10S of the substrate 10 in the third direction D3) than upper ends 47u of the gate spacers 47.

The first dummy gate dielectric layer 82 may be interposed between the first dummy gate line DL1 and the first dummy gate spacer 57, between the first dummy gate line DL1 and the first active region F1 and between the first dummy gate line DL1 and the element isolation layer 30. The first dummy gate dielectric layer 82 may extend along inner side walls of the first dummy gate spacer 57, an upper surface of the first active region F1, a portion of one side wall SW1 of the first active region F1 protruding to the element isolation layer 30, and the upper surface of the element isolation layer 30.

The first dummy gate capping layer 89 may be disposed on (e.g., directly or indirectly on) the first dummy gate line DL1, the first dummy gate spacer 57 and the first dummy gate dielectric layer 82 in at least the third direction D3. A lower surface 89T of the first dummy gate capping layer 89 may be a downwardly-convex curved surface. A height h4 (e.g., thickness in the third direction D3) of the first dummy gate capping layer 89 may be greater than a height h3 (e.g., thickness in the third direction D3) of the gate capping layer 79. The level of the lower surface 89T of the first dummy gate capping layer 89 may be lower than the level of the gate capping layer 79 (e.g., the lower surface 89T of the first dummy gate capping layer 89 may be closer to the upper surface 10S of the substrate 10 in the third direction D3 than, or proximate to the upper surface 10S in relation to, the lower surface 79T of the gate capping layer 79). As shown in at least FIG. 2A, a height h4 of the first dummy gate capping layer 89 in the third direction D3 may be greater than a height h3 of the gate capping layer 79 in the third direction D3. As shown in at least FIG. 2A, the height h4 of the first dummy gate capping layer 89 may refer to a thickness of the first dummy gate capping layer 89 in the third direction D3, and the height h3 of the gate capping layer 79 may refer to a thickness of the gate capping layer 79 in the third direction D3. As shown in at least FIG. 2A, the height h4 of the first dummy gate capping layer 89 may refer to a maximum thickness of the first dummy gate capping layer 89 in the third direction D3, and the height h3 of the gate capping layer 79 may refer to a maximum thickness of the gate capping layer 79 in the third direction D3 Opposite side walls of the first dummy gate capping layer 89 may be inclined with respect to a third direction D3 perpendicular to the upper surface of the substrate 10 while contacting the interlayer insulating layer 60. Restated, the first dummy gate capping layer may be inclined in one direction (e.g., inclined in the first direction D1, and thus inclined at an angle with respect to (e.g., an angle from) the third direction D3, as shown in at least FIG. 2C). For example, the first dummy gate capping layer 89 of the first dummy gate structure DG1 may be inclined toward the gate structure GS disposed on the first active region F1. The first dummy gate capping layer 89 may be inclined in one direction and not other directions (e.g., inclined in only the first direction D1 at a particular angle with respect to the third direction), but example embodiments are not limited thereto.

Similarly to the first dummy gate structure DG1, the second dummy gate structure DG2 may include a second dummy gate line DL2, a second dummy gate spacer 57, a second dummy gate dielectric layer 82 and a second dummy gate capping layer 89. The second dummy gate structure DG2 may have a mirror symmetric structure with the first dummy gate structure DG1. Accordingly, no detailed description will be given of the second dummy gate structure DG2, and it will be understood that the structure of the second dummy gate structure DG2 may be similar or the same as the structure of the first dummy gate structure DG1 as described herein, except that the second dummy gate structure DG2 is at least partially on the second active region F2 instead of the first active region F1. Additionally, it will be understood that the structure of the second dummy gate line DL2 may be similar or the same as the structure of the first dummy gate line DL1 as described herein, except that the second dummy gate line DL2 is at least partially on the second active region F2 instead of the first active region F1. The first dummy gate structure DG1 and the second dummy gate structure DG2 may be inclined in directions away from each other, respectively. Of course, inclination angles of the first dummy gate structure DG1 and the second dummy gate structure DG2 may differ from each other.

The sources/drains S/D may be disposed on the active regions F1 and F2. The sources/drains S/D may be disposed at opposite sides of each gate structure GS and opposite sides of the dummy gate structures DG1 and DG2. The sources/drains S/D may be disposed between the gate structures GS and the dummy gate structures DG1 and DG2. The sources/drains S/D may be constituted by an epitaxial layer, and may include an impurity.

The interlayer insulating layer 60 may be disposed on the field insulating layer 20, and may cover the sources/drains S/D. The interlayer insulating layer 60 may cover side walls of the gate structures GS and side walls of the dummy gate structures DG1 and DG2. That is, the interlayer insulating layer 60 may contact the gate capping layer 79 and the gate spacer 47, and may contact the dummy gate capping layer 89 and the dummy gate spacer 57. In addition, the interlayer insulating layer 60 may cover the upper surface of the element isolation layer 30. Accordingly, and as shown in at least FIGS. 2A-2C, the interlayer insulating layer 60 may cover the element isolation layer 30, the dummy gate spacer 57, and the dummy gate capping layer 89. The interlayer insulating layer 60 may include at least one of silicon oxide, silicon nitride, silicon oxynitride or a low dielectric material having lower permittivity than silicon oxide.

Figure 2C:
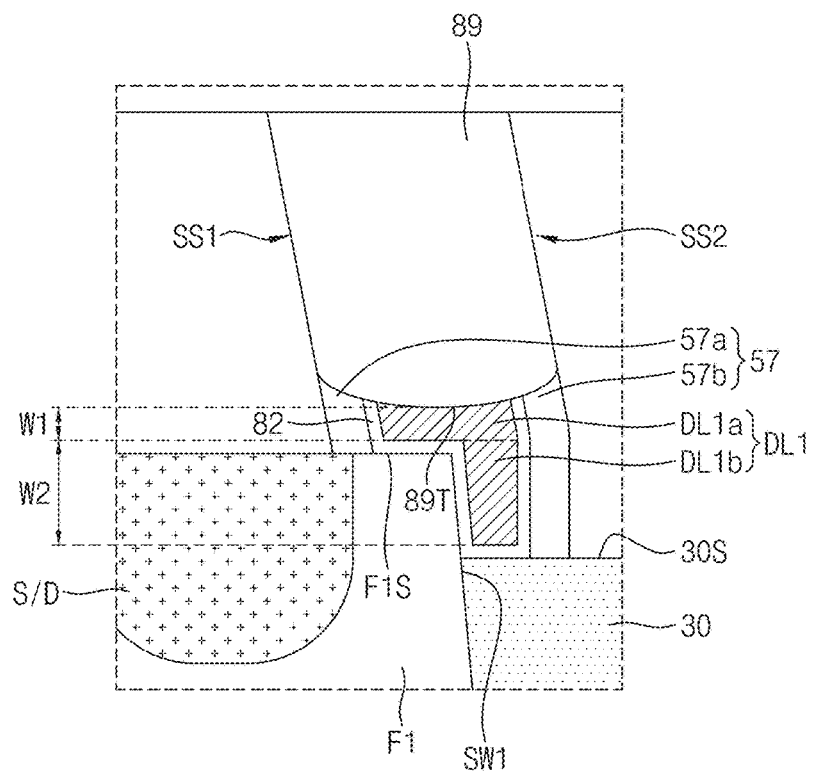
FIG. 2C is an enlarged cross-sectional view showing a portion of FIG. 2 in an enlarged state.

FIG. 2C is an enlarged cross-sectional view showing a portion of FIG. 2 in an enlarged state.

Referring to FIGS. 2A and 2C, the dummy gate line DL may have an L shape. The dummy gate line DL may include a horizontal section DL1a extending at least partially on (e.g., directly or indirectly on) the first active region F1 to the element isolation layer 30 in the first direction D1, which may be a horizontal direction extending parallel to the upper surface 10S of the substrate 10, and a vertical section DL1b extending downwards (e.g., towards the upper surface 10S of the substrate 10) in the third direction D3 (e.g., the vertical direction) from a portion of the horizontal section DL1a and along (e.g., directly or indirectly on in the first direction D1) a side wall SW1 of the first active region F1, such that the first dummy gate line DL1 has an L shape. The vertical section DL1b may be disposed on (e.g., directly or indirectly on) the element isolation layer 30 while extending along one side wall of the first active region F1. In some example embodiments, a height w1 (e.g., thickness in the third direction D3) of the horizontal section DL1a may be smaller than a height w2 (e.g., thickness in the third direction D3) of the vertical section DL1b. Height w1 may be a smallest thickness of the horizontal section DL1a in the third direction D3, and height w2 may be a smallest thickness of the vertical section DL1b in the third direction D3.

As shown in at least FIGS. 2A-2C, the dummy gate capping layer 89 may be on (e.g., directly or indirectly on) both the first dummy gate line DL1 and the first dummy gate spacers (e.g., first and second spacers 57a and 57b) in at least the third direction D3. The dummy gate capping layer 89 may include a first side wall SS1 and a second side wall SS2. As shown in at least FIG. 2C, the first side wall SS1 and the second side wall SS2 may oppose each other. The first side wall SS1 may be disposed on the first active region F1, and the second side wall SS2 may be disposed on the element isolation layer 30. The first side wall SS1 and the second side wall SS2 may be inclined with respect to the third direction D3 perpendicular to the upper surface of the substrate 10.

The dummy gate spacer 57 may include a first spacer 57a and a second spacer 57b. As shown in at least FIG. 2C, the first and second spacers 57a and 57b may be at opposite sides of the first dummy gate line DL1, and thus the first and second spacers 57a and 57b may be referred to as being first dummy gate spacers at opposite side walls of the first dummy gate line DL1 (e.g., opposite sides of the first dummy gate line DL1 in the first direction D1), respectively. The first spacer 57a may be disposed on, or at, one side wall of the dummy gate spacer 57 on the first active region F1, and the second spacer 57b may be disposed on, or at, the other, opposite side wall of the dummy gate spacer 57 on the element isolation layer 30. The first spacer 57a may be disposed on the first active region F1, and the second spacer 57b may be disposed on the element isolation layer 30. The first spacer 57a may have a smaller length than the second spacer 57b. The first spacer 57a and the second spacer 57b may be inclined with respect to the third direction D3 perpendicular to the upper surface of the substrate 10. An outer side wall of the first spacer 57a may be aligned with the first side wall SS1 of the dummy gate capping layer 89 and, as such, may be coplanar therewith. The second spacer 57b may be inclined toward the first spacer 57a as the second spacer 57b extends upwards from the upper surface of the element isolation layer 30. An outer side wall of the second spacer 57b may be aligned with the second side wall SS2 of the dummy gate capping layer 89 and, as such, may be coplanar therewith.

Figure 3A:
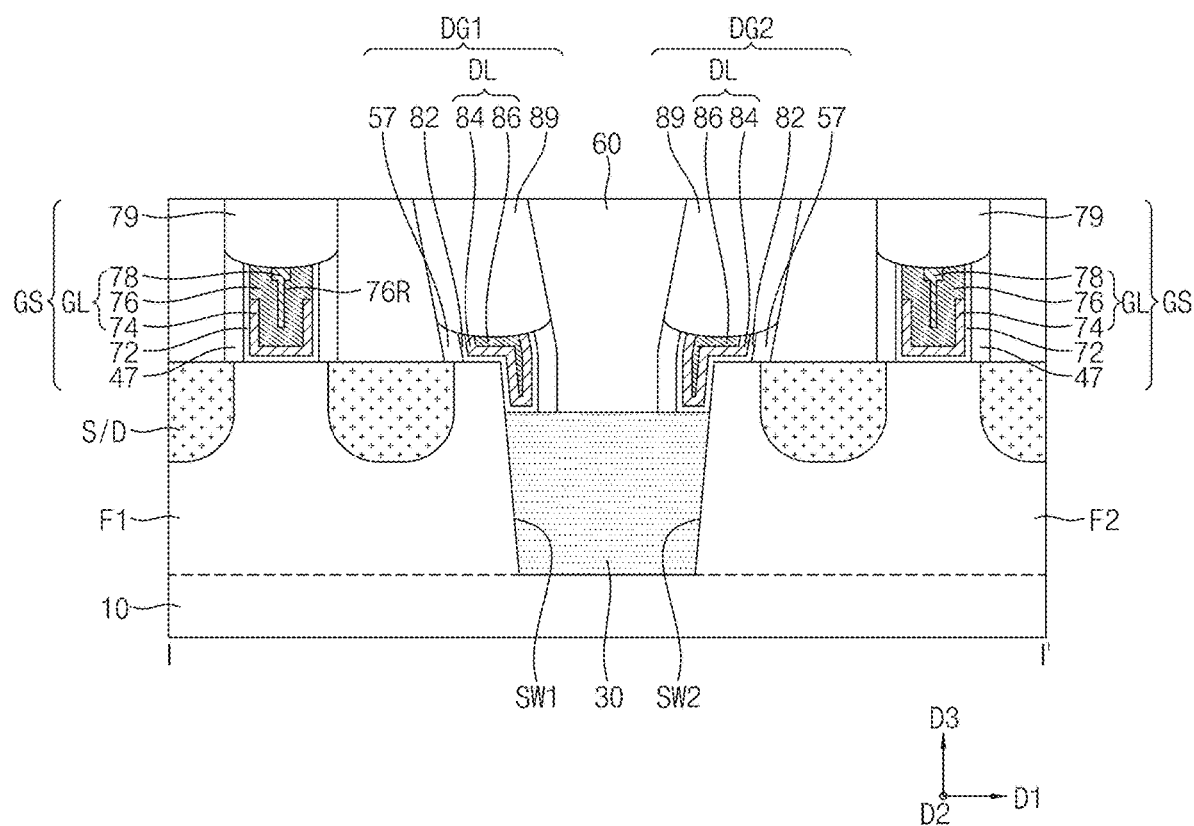
FIG. 3A is a cross-sectional view taken along line I-I' in FIG. 1 in some example embodiments.
Figure 3B:
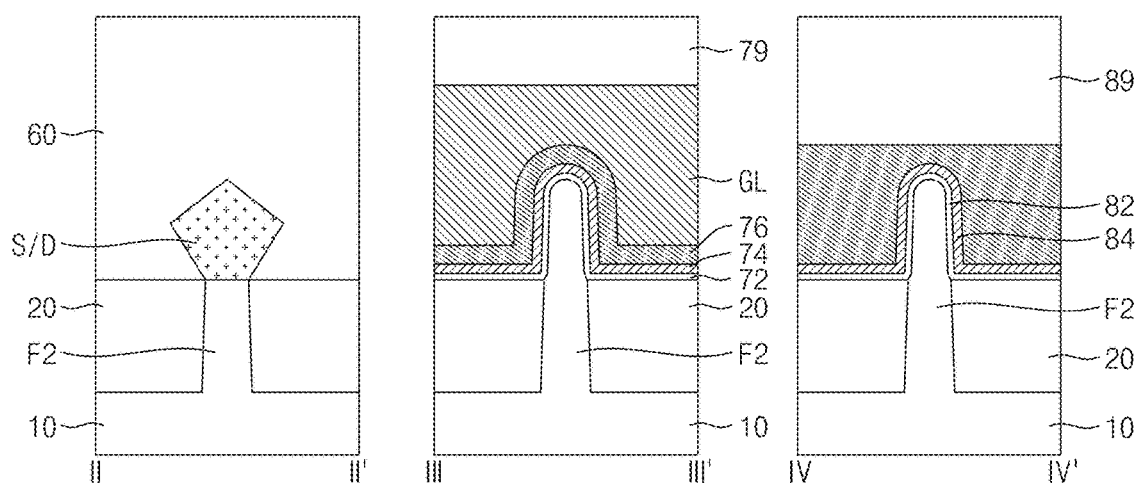
FIG. 3B shows cross-sectional views respectively taken along lines II-II', III III' and IV-IV' in FIG. 1 in some example embodiments.
Figure 3C:
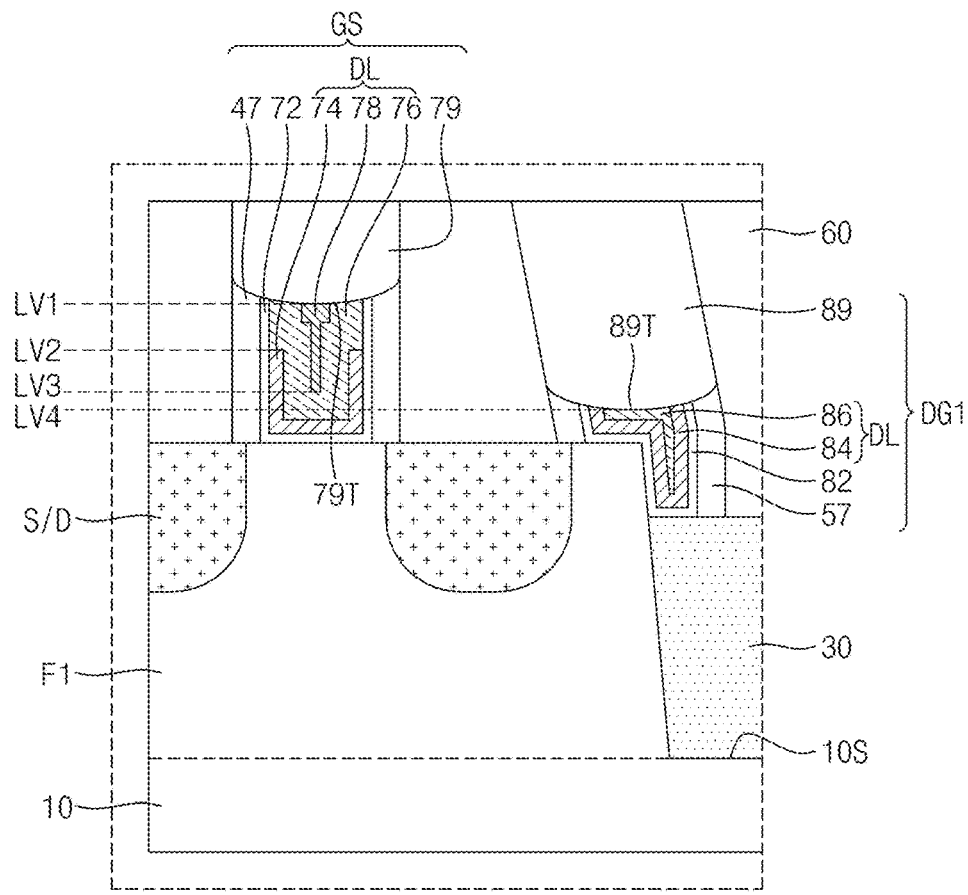
FIG. 3C is an enlarged cross-sectional view showing a portion of FIG. 3A in an enlarged state in some example embodiments.

FIG. 3A is a cross-sectional view taken along line I-I' in FIG. 1 in some example embodiments. FIG. 3B shows cross-sectional views respectively taken along lines II-II', III-III' and IV-IV' in FIG. 1 in some example embodiments. FIG. 3C is an enlarged cross-sectional view showing a portion of FIG. 3A in an enlarged state in some example embodiments. FIGS. 3D, 3E, 3F, and 3G are enlarged cross-sectional views showing a portion of FIG. 3A in an enlarged state in some example embodiments.

Referring to FIGS. 3A and 3B, each gate structure GS may include a gate dielectric layer 72, a gate line GL, a gate spacer 47, and a gate capping layer 79. The gate line GL may include two or more metal layers. In some example embodiments, the gate line GL may include a first gate electrode 74, a second gate electrode 76, and a barrier metal pattern 78.

The first gate electrode 74 may extend in the second direction D2 on the gate dielectric layer 72 while extending along a profile of the active region F1 or F2 protruding through the upper surface of the field insulating layer 20. The cross-section of the first gate electrode 74 may be formed to have a U shape or a shape similar thereto, and thus the first gate electrode 74 may be understood to have a U shape or a shape similar thereto. The first gate electrode 74 may include at least one of metal nitrides, for example, TiN and/or TaN.

The second gate electrode 76 may be disposed on the first gate electrode 74. The second gate electrode 76 may extend in the second direction D2 while extending along the profile of the active region F1 or F2 protruding through the upper surface of the field insulating layer 20. The cross-section of the second gate electrode 76 may be formed to have a U shape, a Y shape, or a shape similar thereto. The second gate electrode 76 may cover upper and inner side surfaces of the first gate electrode 74. The second gate electrode 76 may cover an inner side surface of the gate dielectric layer 72. The second gate electrode 76 may include metal carbide doped with aluminum or silicon. For example, the second gate electrode 76 may include at least one of TiAlC, TaAlC, TiSiC, or TaSiC.

A recess 76R may be formed at an upper portion of the second gate electrode 76. Restated, the second gate electrode 76 may include one or more inner surfaces that define a recess 76R at an upper portion of the second gate electrode 76, for example as shown in at least FIG. 3A. The barrier metal pattern 78 may fill the recess 76R. The barrier metal pattern 78 may entirely fill the recess 76R such that an upper surface of the barrier metal pattern 78 is flush with the upper surface of the second gate electrode 76 (e.g., such that the upper surfaces of the barrier metal pattern 78 and the second gate electrode 76 collectively define a single, continuous surface, such as a single, continuous curved surface, for example as shown in at least FIG. 3A). The barrier metal pattern 78 may extend in the second direction D2. For example, the barrier metal pattern 78 may include metal nitride, for example, TiN.

Each of the dummy gate structures DG1 and DG2 may include a dummy gate dielectric layer 82, a dummy gate line DL, a dummy gate spacer 57, and a dummy gate capping layer 89. The dummy gate line DL may include two or more metal layers. In some example embodiments, the dummy gate line DL may include a first dummy gate electrode 84 and a second dummy gate electrode 86 that is on the first dummy gate electrode 84. The dummy gate line DL may not include (e.g., may exclude) the barrier metal pattern 78, differently from the gate line GL. Restated, the dummy gate line DL may not include any barrier metal pattern, for example as shown in at least FIGS. 3A-3D.

The first dummy gate electrode 84 may extend in the second direction D2 on the dummy gate dielectric layer 82 while extending along the active region F1 or F2 protruding through the upper surface of the field insulating layer 20. The first dummy gate electrode 84 may extend the upper surface of the active region F1 or F2 and one side wall SW1 or SW2 of the active region F1 or F2. A recess may be formed at an upper portion of the first dummy gate electrode 84.

The second dummy gate electrode 86 may be disposed on the first dummy gate electrode 84. The second dummy gate electrode 86 may fill the recess of the first dummy gate electrode 84. The second dummy gate electrode 86 may be surrounded by the first dummy gate electrode 84, except for an upper surface thereof. The upper surface of the second dummy gate electrode 86 may contact a lower surface 89T of the dummy gate capping layer 89. The cross-section of the second dummy gate electrode 86 may have an L shape. The first dummy gate electrode 84 may include the same material as the first gate electrode 74. The second dummy gate electrode 86 may include the same material as the second gate electrode 76.

Referring to FIG. 3C, the gate capping layer 79 and the first gate electrode 74 may be vertically spaced apart from each other, for example, such that an upper end of the first gate electrode 74 (e.g., at level LV2) is isolated from direct contact with the gate capping layer 79 in the third direction D3. A level LV1 of the lower surface 79T of the gate capping layer 79 (e.g., the lowest level of the lower surface 79T) may be higher than (e.g., distal to the upper surface 10S in relation to) a level LV2 of an upper end of the first gate electrode 74. The second gate electrode 76 may extend between the gate capping layer 79 and the first gate electrode 74. A level LV3 of a lower end of the barrier metal pattern 78 may be lower than (e.g., proximate to the upper surface 10S in the third direction D3 in relation to) the level LV2 of the upper end of the first gate electrode 74. It will be understood that, as described herein, a "lower end" of a structure may refer to the lowest portion (e.g., the portion most proximate to the upper surface 10S in the third direction D3) of that given structure.

In some example embodiments, a level LV4 of a lower surface 89T (e.g., the lowest level of the lower surface 89T) of the dummy gate capping layer 89 may be lower than the level LV2 of the upper end of the first gate electrode 74. In some example embodiments, the level LV4 of the lower surface 89T (e.g., the lowest level of the lower surface 89T) of the dummy gate capping layer 89 may be lower than (e.g., proximate to the upper surface 10S in the third direction D3 in relation to) the level LV3 of the lower end of the barrier metal pattern 78. Accordingly, an upper end of the dummy gate dielectric layer 82 and an upper surface of the dummy gate line DL, which contact the lower surface 89T of the dummy gate capping layer 89, may also be lower than the level LV3 of the lower end of the barrier metal pattern 78.

Figure 3D:
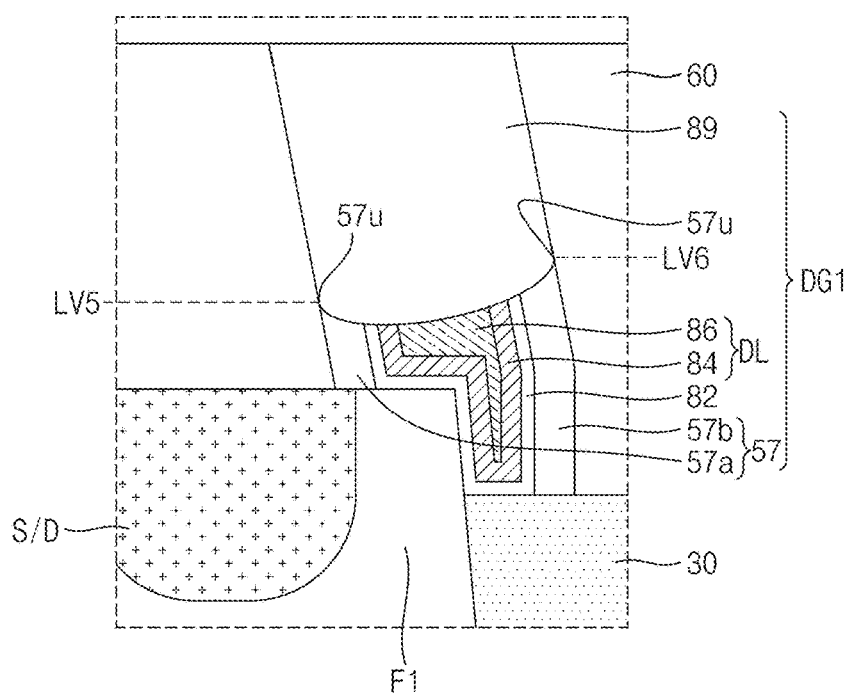
FIGS. 3D, 3E, 3F, and 3G are enlarged cross-sectional views showing a portion of FIG. 3A in an enlarged state in some example embodiments.

Referring to FIG. 3D, in some example embodiments, the dummy gate spacer 57 may include a first spacer 57a disposed on the first active region F1, and a second spacer 57b disposed on the element isolation layer 30. In some example embodiments, a level LV5 of an upper end 57u of the first spacer 57a may differ from a level LV6 of an upper end 57u of the second spacer 57b. For example, the level LV5 of the upper end 57u of the first spacer 57a may be lower than the level LV6 of the upper end 57u of the second spacer 57*b*, such that the upper end 57*u* of the second spacer 57*b* is at a higher level that (e.g., distal to the upper surface 10S in relation to) the upper end 57*u* of the first spacer 57*a* in the third direction D3. As shown, the upper end 57*u* of a given spacer 57 may refer to the highest portion (e.g., the portion most distal from the upper surface 10S in the third direction D3) of the given spacer 57.

Figure 3E:
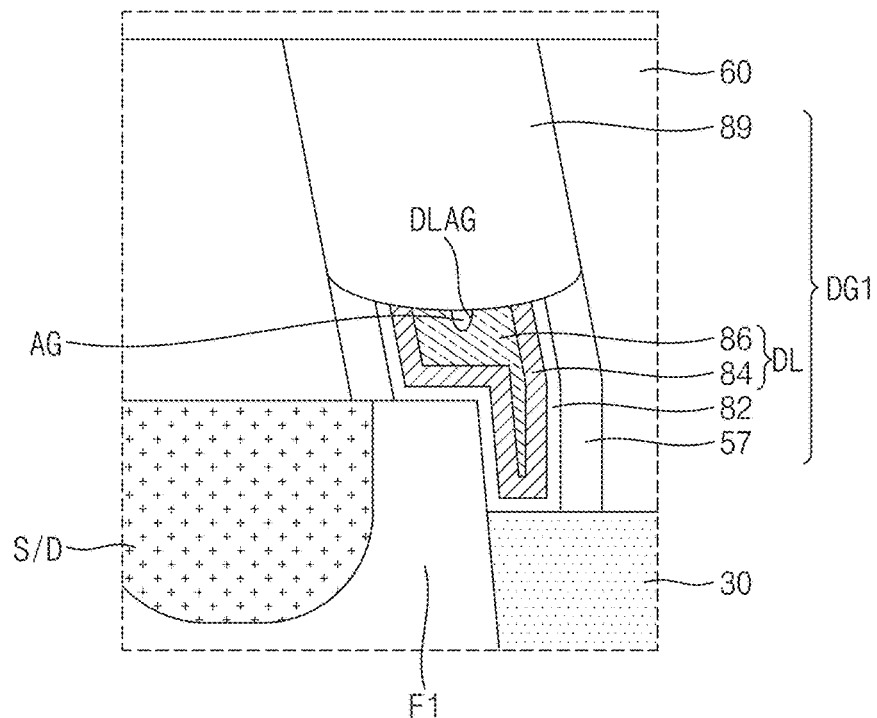

Referring to FIG. 3E, in some example embodiments, an air gap AG may be formed within the second dummy gate electrode 86. The air gap AG may be disposed at an upper portion of the second dummy gate electrode 86, and may contact the lower surface 89T of the dummy gate capping layer 89. As a result, in some example embodiments, the dummy gate line DL (which may correspond to the first dummy gate line DL1 as described with reference to FIGS. 2A-2C) may have one or more surfaces DLAG that at least partially define an air gap AG that is at least partially located within the dummy gate line DL (e.g., at least partially or entirely within a volume defined by outer surfaces of the dummy gate line DL (e.g., surfaces of the dummy gate line DL that contact the dummy gate capping layer 89 and/or dielectric layer 82 as shown in at least FIG. 3E)). As shown in FIG. 3E, the air gap AG may be exposed to, and thus contact, the lower surface of the dummy gate capping layer 89, but example embodiments are not limited thereto, and in some example embodiments the air gap AG may be entirely enclosed within the second dummy gate electrode 86.

Figure 3F:
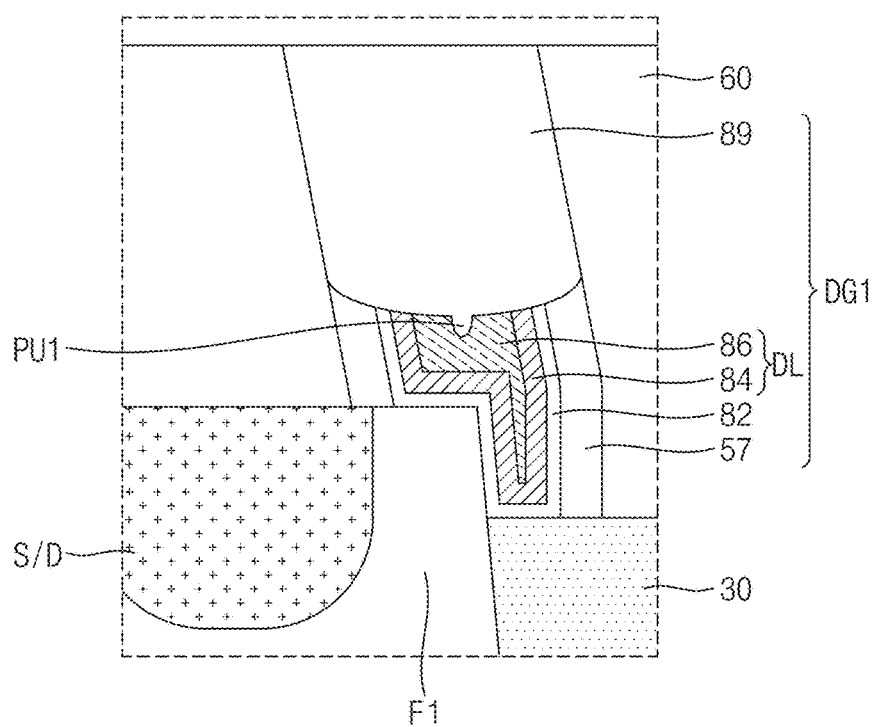

Referring to FIG. 3F, in some example embodiments, the dummy gate capping layer 89 may include a protrusion PU1 extending downwards (e.g., towards the upper surface 10S of the substrate 10 in the third direction D3) from the lower surface of the dummy gate capping layer 89. The protrusion PU1 may protrude into the second dummy gate electrode 86 and thus may protrude into the dummy gate line DL (e.g., protruding into a volume defined by outer surfaces of the dummy gate line DL (e.g., surfaces of the dummy gate line DL that contact the dummy gate capping layer 89 and/or dielectric layer 82 as shown in at least FIG. 3F)). As illustrated in FIG. 3E, the protrusion PU1 may be formed as the air gap AG formed at the second dummy gate electrode 86 is filled with an insulating material for formation of the dummy gate capping layer 89.

Figure 3G:
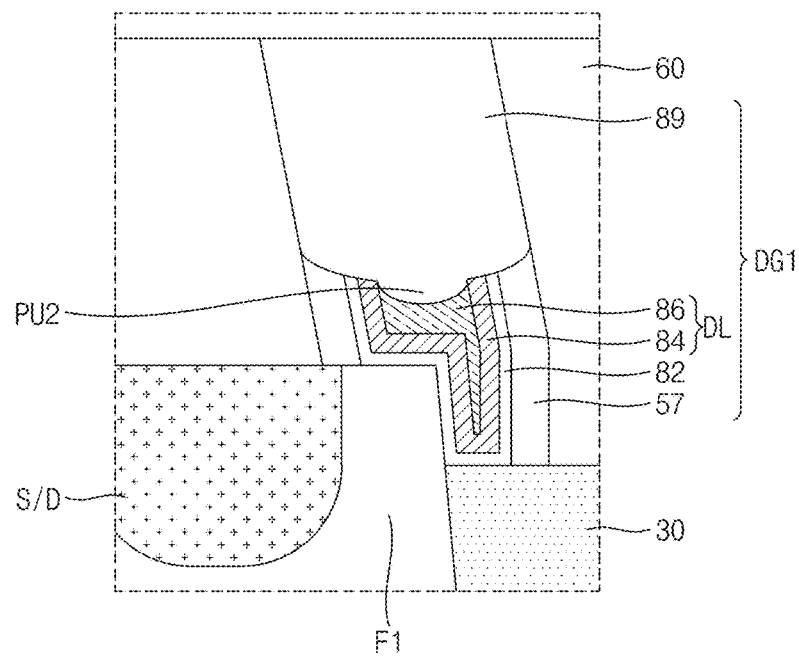

Referring to FIG. 3G, in some example embodiments, the dummy gate capping layer 89 may include a protrusion PU2 extending downwards from the lower surface of the dummy gate capping layer 89. Differently from the case of FIG. 3F, the protrusion PU2 may contact the first dummy gate electrode 84 as well as the second dummy gate electrode 86. An air gap AG may be formed in the second dummy gate electrode 86 during a procedure of etching the dummy gate line DL, the dummy gate dielectric layer 82 and the dummy gate spacer 57 in order to form the dummy gate capping layer 89. As a central portion of the second dummy gate electrode 86 is rapidly etched during formation of the air gap, the resultant air gap may be formed to have an increased width until the air gap is brought into contact with the first dummy gate electrode 84. As an insulating material for formation of the dummy gate capping layer 89 is formed in the air gap formed to have an increased width, as described above, the protrusion PU2 contacting the first dummy gate electrode 84 may be formed.

Figure 4A:
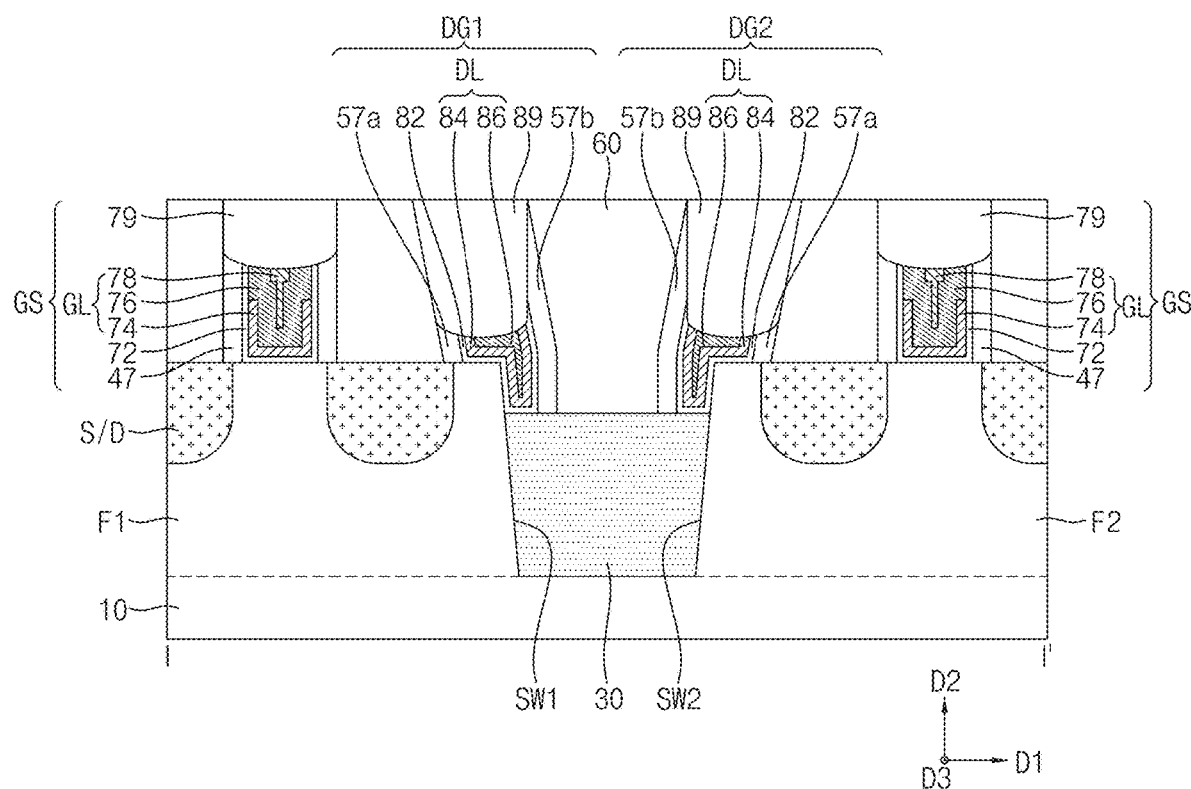
FIG. 4A is a cross-sectional view taken along line I-I' in FIG. 1 in some example embodiments.
Figure 4B:
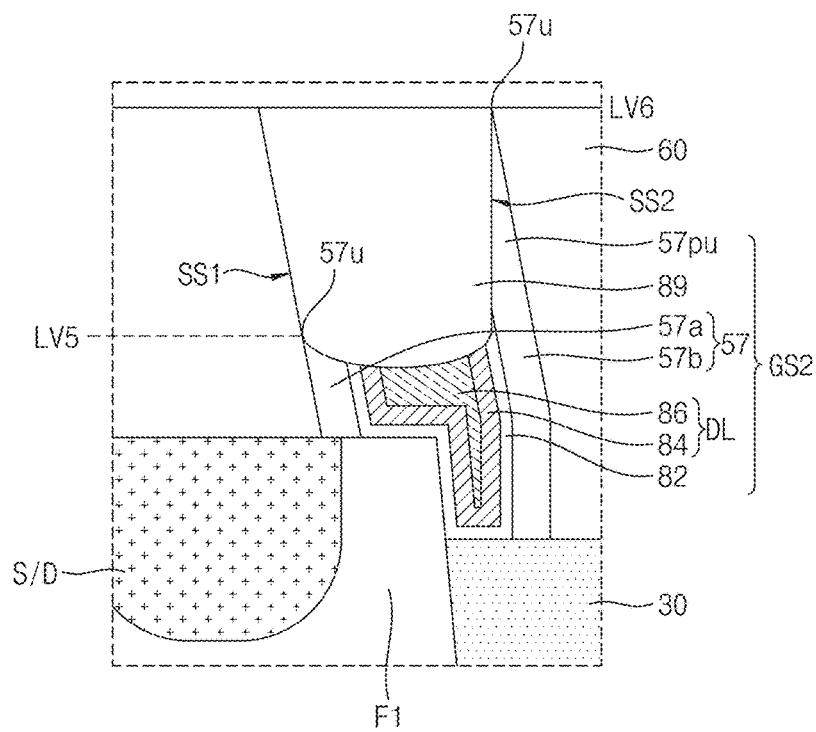
FIG. 4B is an enlarged cross-sectional view showing a portion of FIG. 4A in an enlarged state in some example embodiments.

FIG. 4A is a cross-sectional view taken along line I-I' in FIG. 1 in some example embodiments. FIG. 4B is an enlarged cross-sectional view showing a portion of FIG. 4A in an enlarged state in some example embodiments.

Referring to FIGS. 4A and 4B, in some example embodiments, the first dummy gate capping layer 89 may include a first side wall SS1 inclined with respect to the third direction D3 that is perpendicular to a main surface (e.g., the upper surface 10S) of the substrate 10, and a second side wall SS2 perpendicular to the main surface of the substrate 10. The first side wall SS1 may contact the interlayer insulating layer 60. The first side wall SS1 may be coplanar with an outer side surface of the first spacer 57*a*. The second side wall SS2 may be spaced apart from (e.g., isolated from direct contact with) the interlayer insulating layer 60. In some example embodiments, one portion of the second side wall SS2 may contact the interlayer insulating layer 60, and the other portion of the second side wall SS2 may be spaced apart from the interlayer insulating layer 60. The second spacer 57*b* may be partially interposed between the second side wall SS2 and the interlayer insulating layer 60.

In some example embodiments, the level LV5 of the upper end 57*u* of the first spacer 57*a* may differ from the level LV6 of the upper end 57*u* of the second spacer 57*b*. The level LV5 of the upper end 57*u* of the first spacer 57*a* may be lower than the level LV6 of the upper end 57*u* of the second spacer 57*b*. In some example embodiments, the level of the upper end 57*u* of the first spacer 57*a* may be lower than the level of the upper end of the gate spacer 47. In some example embodiments, the level of the upper end 57*u* of the second spacer 57*b* may be higher than the level of the upper end of the gate spacer 47. It will be understood that a "level" as used herein may refer to a distance from the upper surface 10S of the substrate 10 in the third direction D3, such that a level that is higher or lower than another level may be understood to be distal (e.g., further from) or proximate (e.g., closer) to the upper surface 10S than the other level.

In some example embodiments, the second spacer 57*b* may include an extension 57*pu* extending between the dummy gate capping layer 89 and the interlayer insulating layer 60. The extension 57*pu* may extend to a higher level than the upper end of the gate spacer 47 while extending upwards from the lower surface of the dummy gate capping layer 89. In some example embodiments, the extension 57*pu* may have a width gradually decreasing as the extension 57*pu* extends upwards. As shown, the second spacer 57*b* may thus cover (e.g., completely cover) the second side wall SS2 of the dummy gate capping layer 89 that extends perpendicular to the upper surface 10S. The extension 57*pu* of the second spacer 57*b* may be understood to be interposed between the dummy gate capping layer 89 and the interlayer insulating layer 60.

Figure 5:
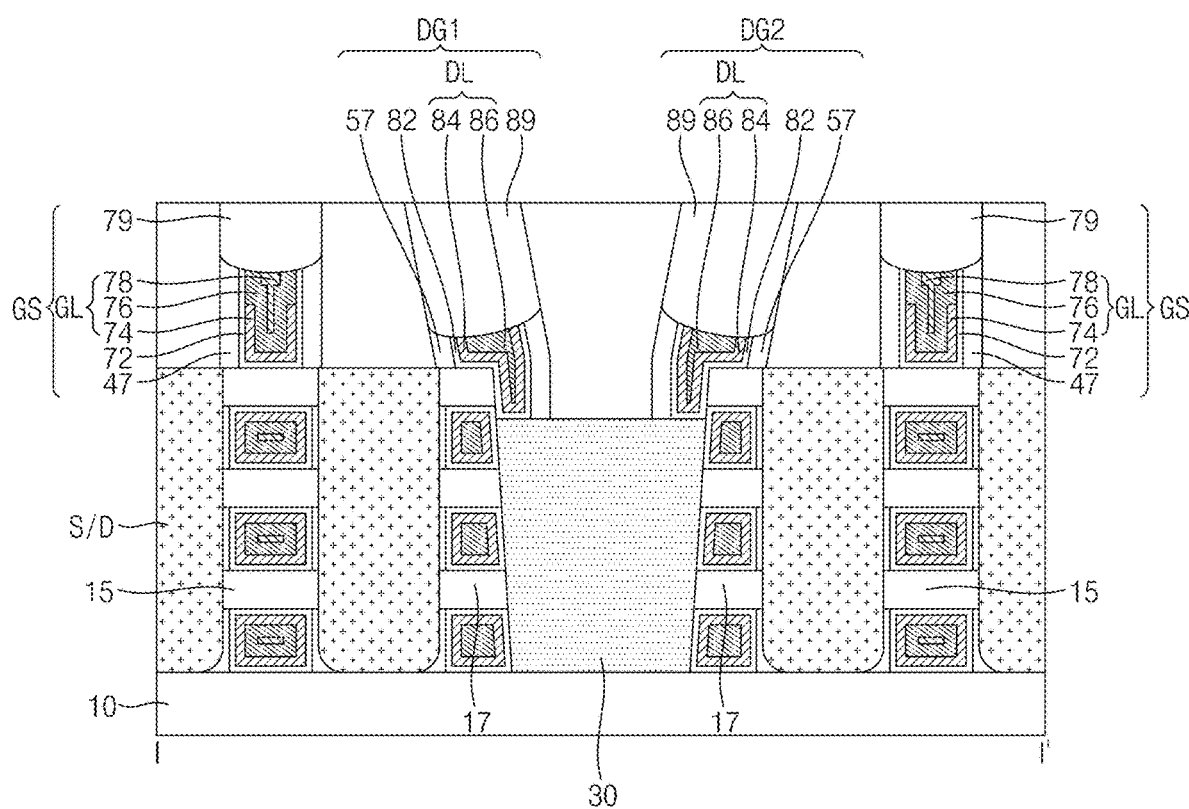
FIG. 5 is a cross-sectional view taken along line I-I' in FIG. 1 in some example embodiments.

FIG. 5 is a cross-sectional view taken along line I-I' in FIG. 1 in some example embodiments.

The contents explained with reference to FIGS. 1 to 4B may be applied to a gate-all-around (GAA) FET, a multi-bridge channel (MBC) FET, etc. in the same manner. In detail, referring to FIG. 5, a semiconductor device may include active regions 15 and 17 disposed on a substrate 10. The active regions 15 and 17 may include a plurality of channel patterns 15 and a plurality of dummy channel patterns 17. The channel patterns 15 and the dummy channel patterns 17 may extend in the first direction D1 while being spaced apart from one another in the third direction D3. A gate line GL may be disposed between the channel patterns 15 spaced apart from each other in the third direction D3. A dummy gate line DL may be disposed between the dummy channel patterns 17 spaced apart from each other in the third direction D3. Gate structures GS may be disposed on the channel patterns 15, respectively.

An element isolation layer 30 may be disposed between the dummy channel patterns 17. The level of an upper surface of the element isolation layer 30 may be lower than the level of an upper surface of the dummy channel pattern 17 disposed at an uppermost position from among the dummy channel patterns 17. Dummy gate structures DG1 and DG2 may be disposed on the dummy channel patterns 17 and the element isolation layer 30, and may be inclined in the second direction D2.

FIGS. 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B are cross-sectional views explaining a method for manufacturing a semiconductor device in accordance with some example embodiments of the inventive concepts.

Figure 6A:
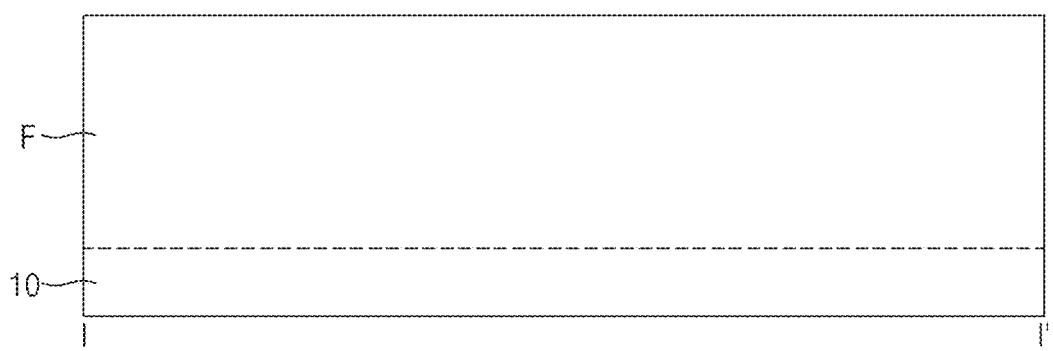
FIGS. 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B are cross-sectional views explaining a method for manufacturing a semiconductor device in accordance with some example embodiments of the inventive concepts.
Figure 6B:
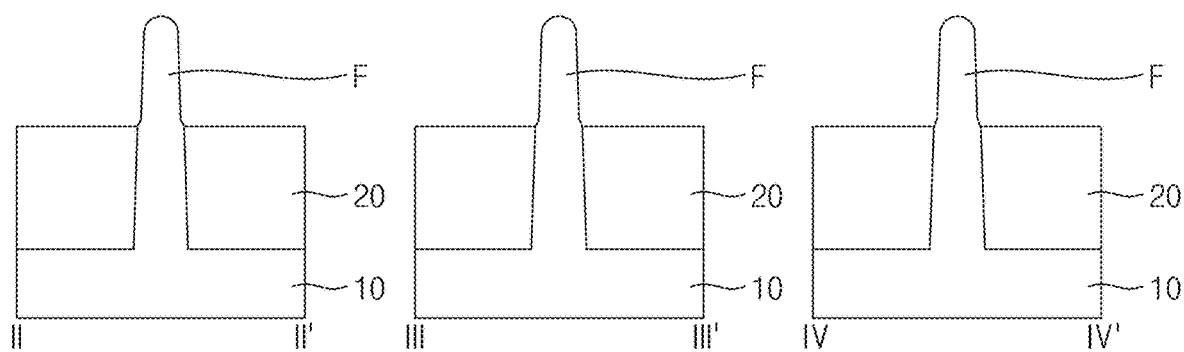

Referring to FIGS. 6A and 6B, the method may include partially etching a substrate 10, thereby forming an active region F. The active region F may extend lengthily in one direction while protruding upwards from a main surface of the substrate 10.

The method may include forming a field insulating layer 20 partially covering the active region F. Formation of the field insulating layer 20 may include forming, on the substrate 10, an insulating layer covering the active region F, and partially etching back the insulating layer until an upper portion of the active region F is exposed.

Figure 7A:
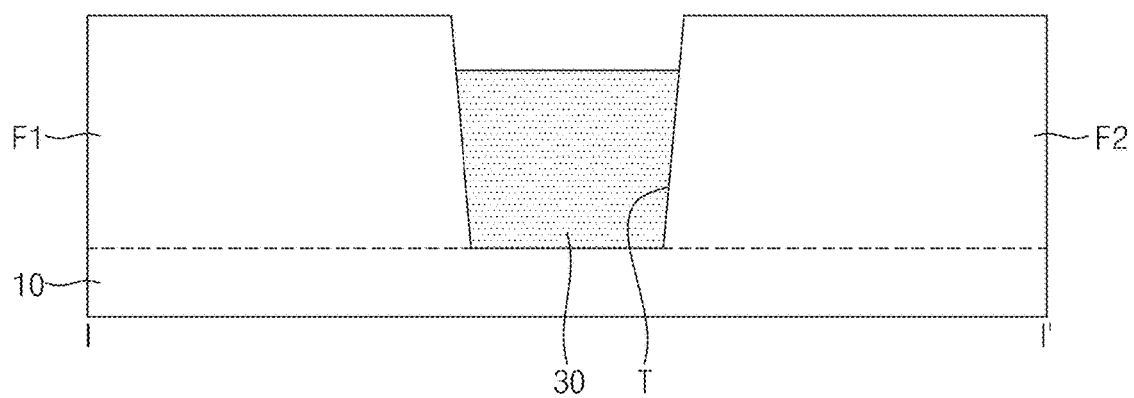
Figure 7B:
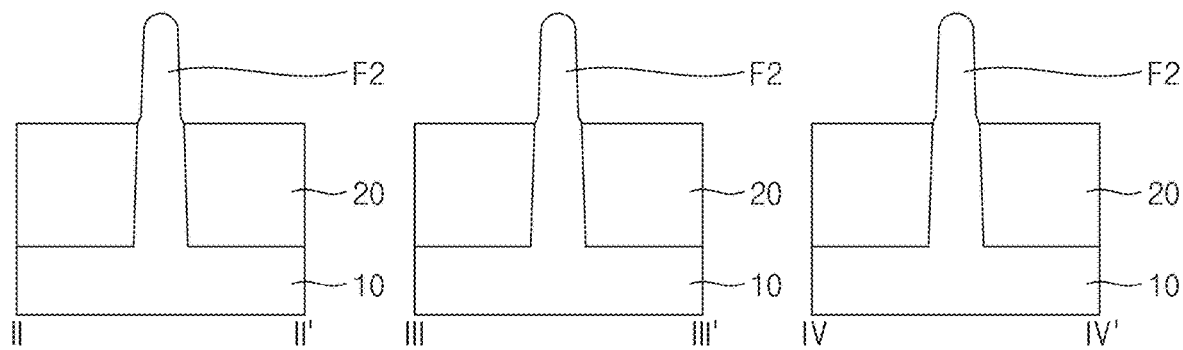

Referring to FIGS. 7A and 7B, the method may include partially etching the active region F, thereby forming a trench T, and forming an element isolation layer 30 in the trench T. The active region F may be divided into a first active region F1 and a second active region F2 by the trench F. The element isolation layer 30 may incompletely fill the trench T. As a result, an upper surface of the element isolation layer 30 may have a lower level than upper ends of the active regions F1 and F2.

Figure 8A:
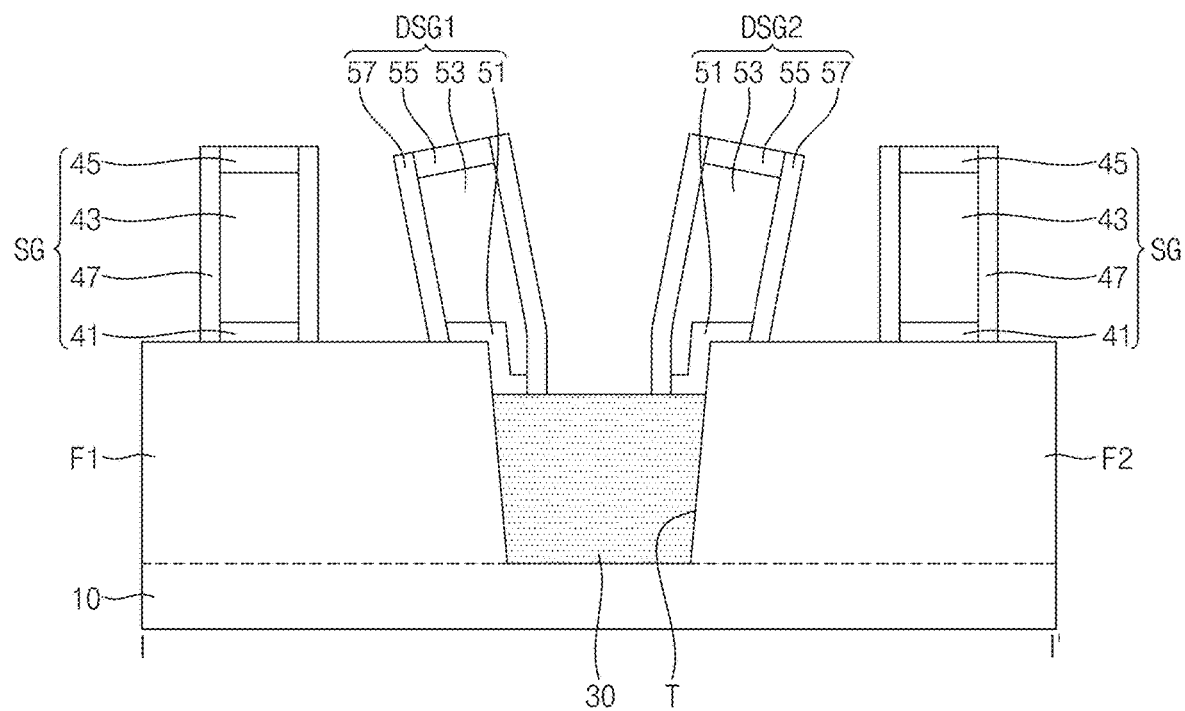
Figure 8B:
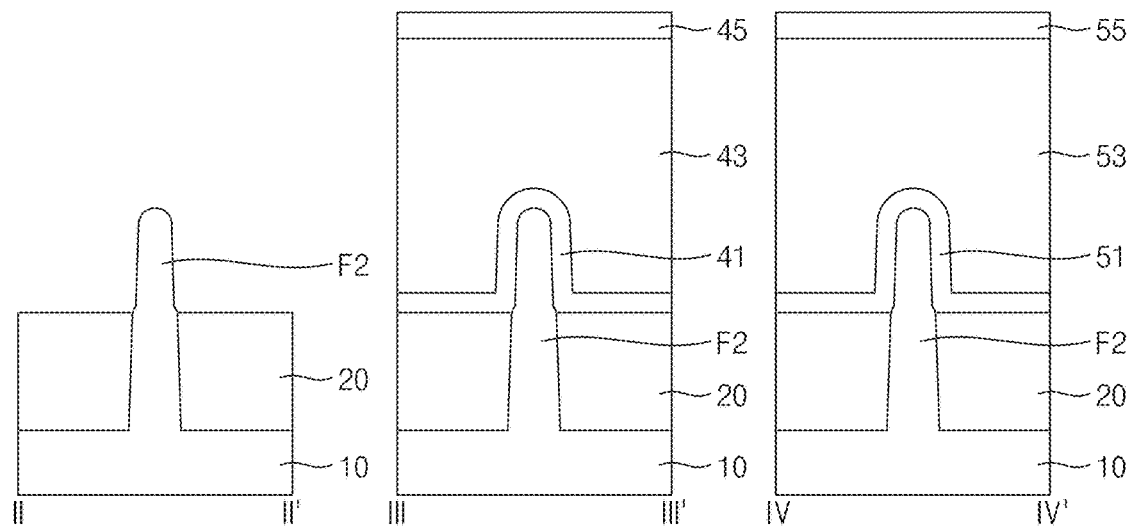

Referring to FIGS. 8A and 8B, the method may include forming sacrificial gate structures SG and dummy sacrificial gate structures DSG1 and DSG2 on the active regions F1 and F2 and the element isolation layer 30.

Formation of the sacrificial gate structures SG and the dummy sacrificial gate structures DSG1 and DSG2 may include sequentially forming sacrificial gate insulating layers 41 and 51, sacrificial gate lines 43 and 53, and sacrificial capping layers 45 and 55. The sacrificial gate insulating layers 41 and 51 may include silicon oxide. The sacrificial gate lines 43 and 53 may include polysilicon. The sacrificial capping layers 45 and 55 may include at least one of silicon oxide, silicon nitride, or silicon oxynitride.

Thereafter, gate spacers 47 may be formed at opposite side walls of the sacrificial gate insulating layer 41, the sacrificial gate line 43, and the sacrificial capping layer 45, respectively. Dummy gate spacers 57 may be formed at opposite side walls of the sacrificial gate insulating layer 51, the sacrificial gate line 53, and the sacrificial capping layer 55, respectively. The gate spacers 47 and the dummy gate spacers 57 may include at least one of silicon nitride or silicon oxynitride.

The sacrificial gate structures SG may be formed on the first active region F1 and the element isolation layer 30. The sacrificial gate structures SG may be formed on the second active region F2 and the element isolation layer 30.

In some example embodiments, formation of the dummy sacrificial gate structures DSG1 and DSG2 may include forming a first dummy sacrificial gate structure DSG1 and a second dummy sacrificial gate structure DSG2. A portion of the first dummy sacrificial gate structure DSG1 may be formed on the first active region F1, and the other portion of the first dummy sacrificial gate structure DSG1 may be formed on the element isolation layer 30. Accordingly, a lower surface of the first dummy sacrificial gate structure DSG1 may be formed along upper and side surfaces of the first active region F1 and an upper surface of the element isolation layer 30 and, as such, may have a step. A portion of the second dummy sacrificial gate structure DSG2 may be formed on the second active region F2, and the other portion of the second dummy sacrificial gate structure DSG2 may be formed on the element isolation layer 30. Accordingly, a lower surface of the second dummy sacrificial gate structure DSG2 may be formed along upper and side surfaces of the second active region F2 and an upper surface of the element isolation layer 30 and, as such, may have a step.

The first dummy sacrificial gate structure DSG1 and the second dummy sacrificial gate structure DSG2 may be formed to be inclined outwards of the element isolation layer 30. For example, the first dummy sacrificial gate structure DSG1 disposed at a left side of the element isolation layer 30 may be inclined in a left direction, whereas the second dummy sacrificial gate structure DSG2 disposed at a right side of the element isolation layer 30 may be inclined in a right direction. That is, the first dummy sacrificial gate structure DSG1 and the second dummy sacrificial gate structure DSG2, which are disposed on the element isolation layer 30 while being spaced apart from each other, may be inclined in directions away from each other, respectively. In some example embodiments, one of the first dummy sacrificial gate structure DSG1 or the second dummy sacrificial gate structure DSG2, which are disposed on the element isolation layer 30 while being spaced apart from each other, may be inclined in a direction in which the one dummy sacrificial gate structure is spaced away from the other dummy sacrificial gate structure, and the other dummy sacrificial gate structure may not be inclined. For example, a portion of the first dummy sacrificial gate structure DSG1 and/or the second dummy sacrificial gate structure DSG2 contacting the element isolation layer 30 may be stressed by the element isolation layer 30 and, as such, may be inclined.

As a result, for example, the width between the first dummy sacrificial gate structure DSG1 and the second dummy sacrificial gate structure DSG2 disposed on the single element isolation layer 30 is smaller at a lower level than upper ends of the active regions F1 and F2 than at a higher level than the upper ends of the active regions F1 and F2. That is, the width between the first dummy sacrificial gate structure DSG1 and the second dummy sacrificial gate structure DSG2 disposed on the single element isolation layer 30 may gradually increase as the first dummy sacrificial gate structure DSG1 and the second dummy sacrificial gate structure DSG2 extend upwards from the upper ends of the active regions F1 and F2. In some example embodiments, the width between the first dummy sacrificial gate structure DSG1 and the sacrificial gate structure SG disposed adjacent thereto may gradually decrease as the first dummy sacrificial gate structure DSG1 and the sacrificial gate structure SG extend upwards from the upper end of the active region F1. Similarly, the width between the second dummy sacrificial gate structure DSG2 and the sacrificial gate structure SG disposed adjacent thereto may gradually decrease as the second dummy sacrificial gate structure DSG2 and the sacrificial gate structure SG extend upwards from the upper end of the active region F2.

Figure 9A:
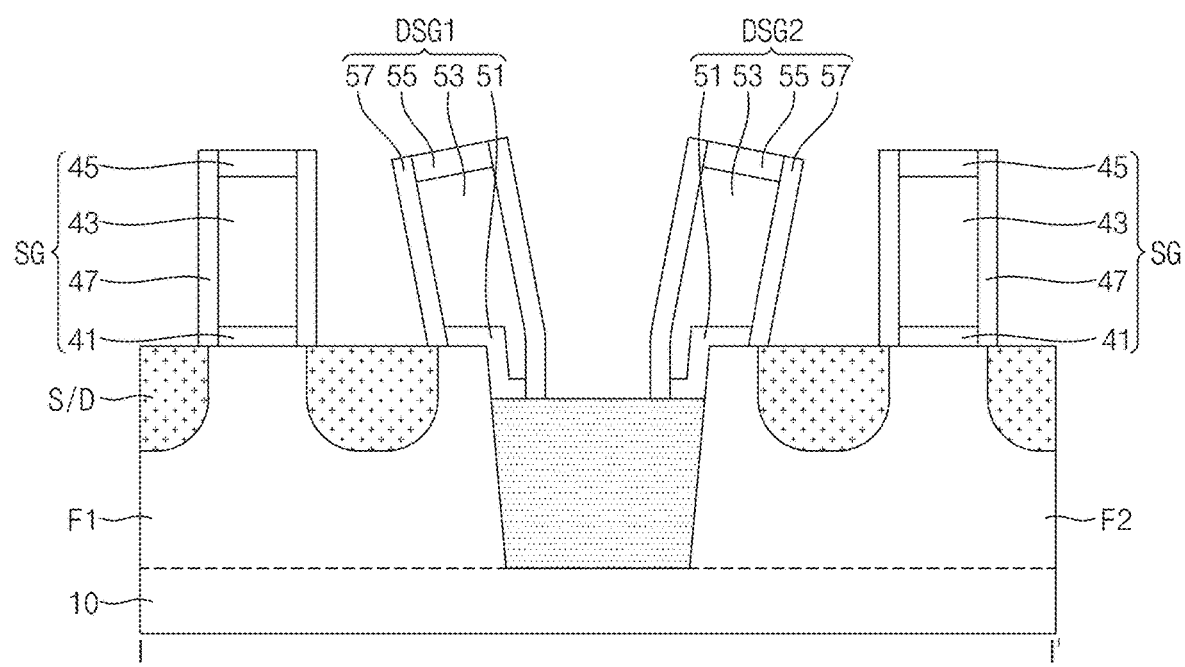
Figure 9B:
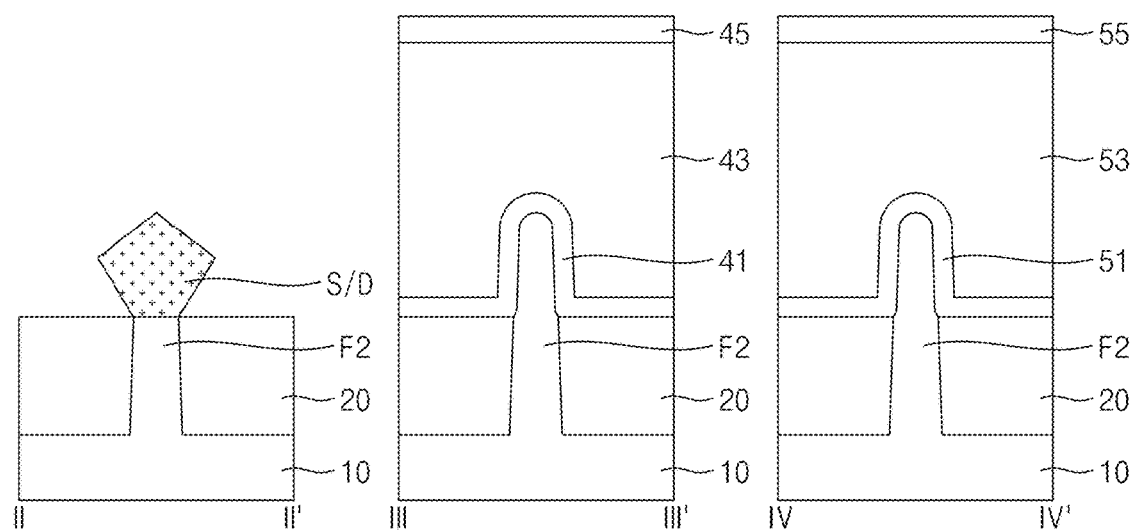

Referring to FIGS. 9A and 9B, the method may include recessing the active regions F1 and F2 exposed between the sacrificial gate structures SG and the dummy sacrificial gate structures DSG1 and DSG2, and forming sources/drains S/D in recessed areas of the active regions F1 and F2, respectively. For example, the sources/drains S/D may include silicon germanium doped with a p-type impurity and silicon (Si) doped with an n-type impurity. The sources/drains S/D may be formed through an epitaxial growth process. The cross-sections of the sources/drains S/D may have various shapes such as a circular shape, a pentagonal shape, or a hexagonal shape.

Figure 10A:
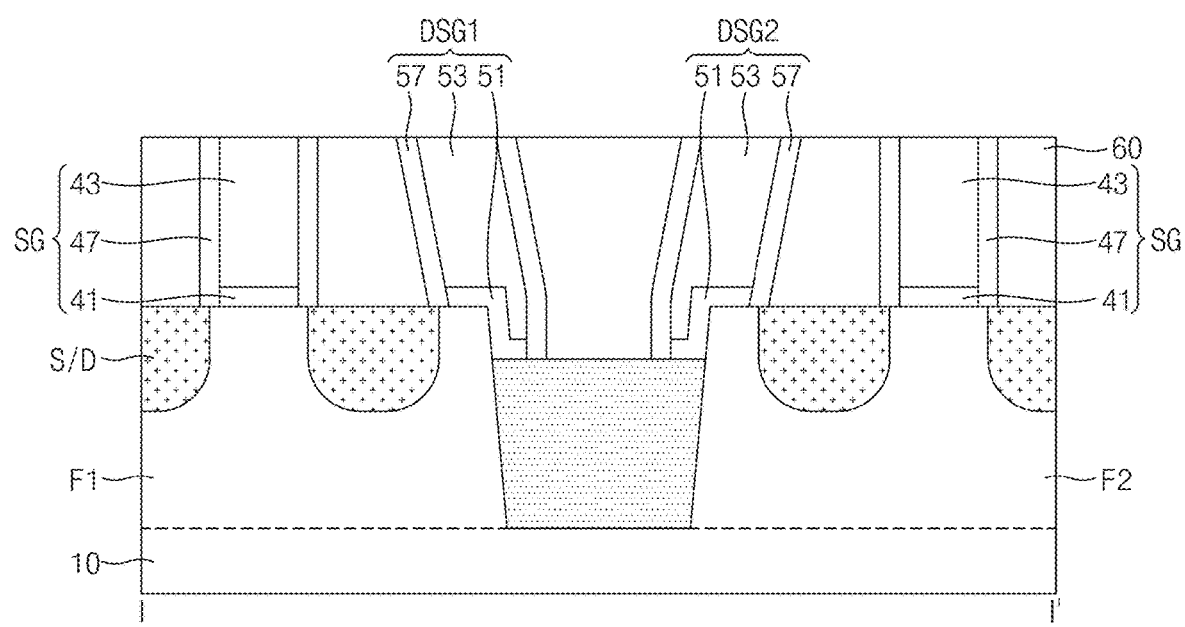
Figure 10B:
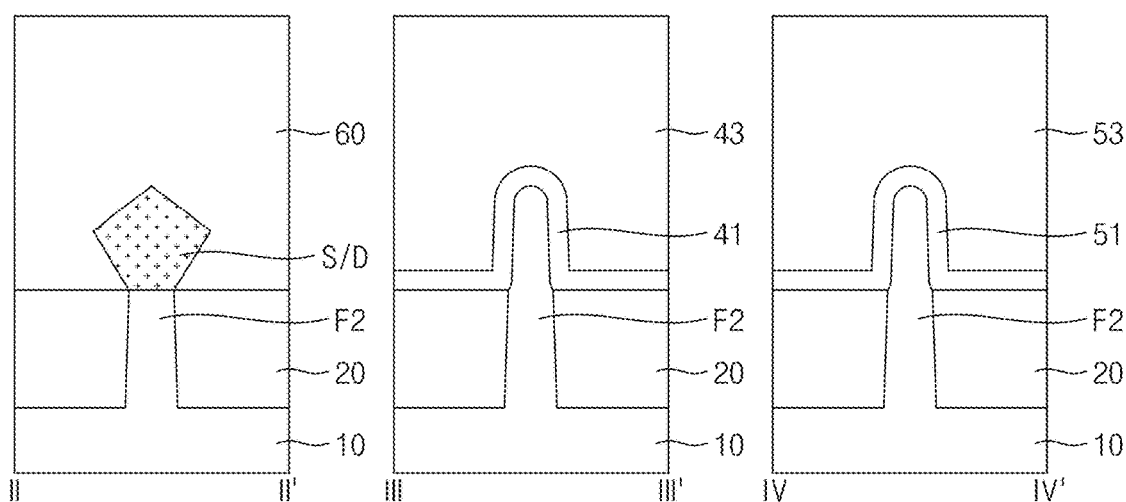

Referring to FIGS. 10A and 10B, the method may include forming an interlayer insulating layer 60. Formation of the interlayer insulating layer 60 may include forming an insulating layer covering the sacrificial gate structures SG, the dummy sacrificial gate structures DSG1 and DSG2, the element isolation layer 30 and the field insulating layer 20, and subsequently performing a chemical mechanical polishing (CMP) process. Through the CMP process, the sacrificial capping layers 45 and 55 of the sacrificial gate structures SG and the dummy sacrificial gate structures SG1 and SG2 are removed and, as such, upper surfaces of the sacrificial gate lines 43 and 53 may be exposed. For example, the interlayer insulating layer 60 may include an oxide.

Figure 11A:
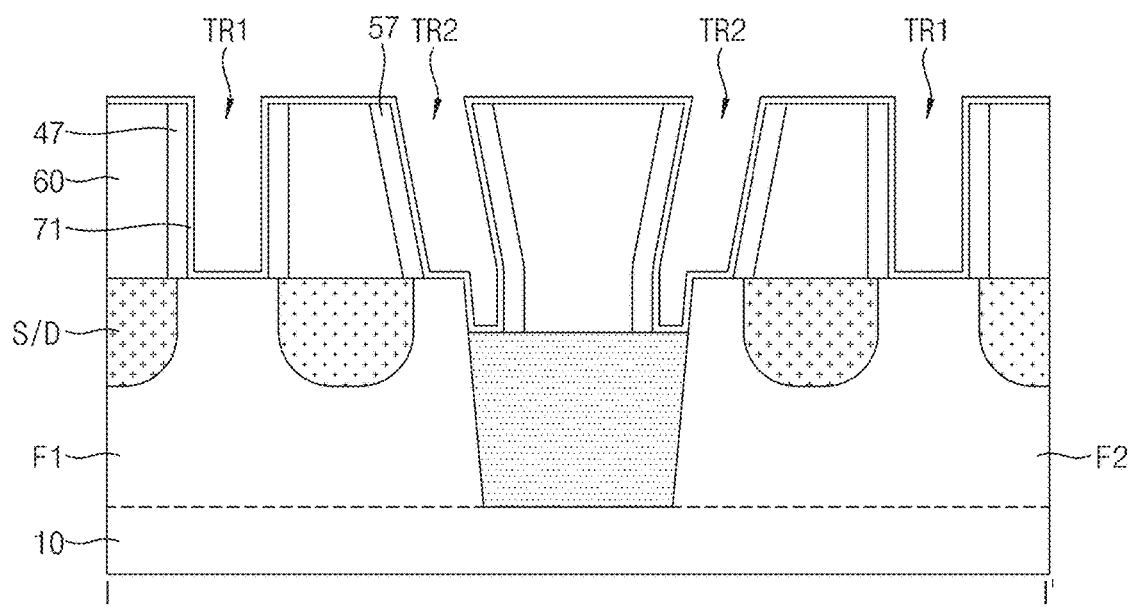
Figure 11B:
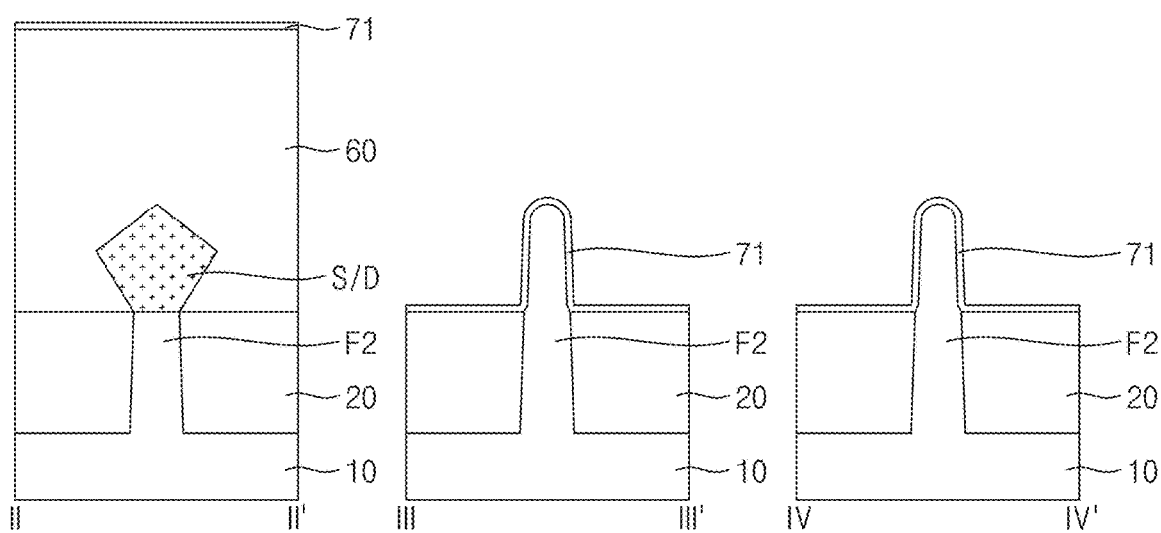

Referring to FIGS. 11A and 11B, the method may include removing the sacrificial gate lines 43 and 53, and forming trenches TR1 and TR2. The trenches TR1 and TR2 may include first trenches TR1 formed through removal of the sacrificial gate line 43 and the sacrificial gate insulating layer 41 in each sacrificial gate structure SG, and second trenches TR2 formed through removal of the sacrificial gate line 53 and the sacrificial gate insulating layer 51 in each of the first dummy sacrificial gate structure DSG1 and the second dummy sacrificial gate structure DSG2. The first trenches TR1 may have a shape extending vertically, and the second trenches TR2 may have an inclined shape. Inner side walls of the gate spacers 47 and 57 and the active regions F1 and F2 may be exposed through the trenches TR1 and TR2.

The method may include forming a dielectric layer 71 partially filling the trenches TR1 and TR2. The dielectric layer 71 may be conformally formed in the first trenches TR1 along inner side surfaces of the gate spacers 47 and upper surfaces of the active regions F1 and F2. In addition, the dielectric layer 71 may be conformally formed in the second trenches TR2 along inner side surfaces of the dummy gate spacers 57, the upper surfaces of the active regions F1 and F2 and the upper surface of the element isolation layer 30. For example, the dielectric layer 71 may be constituted by a silicon oxide film, a high dielectric film, or a combination thereof. The high dielectric film may be made of a material having a greater dielectric constant than a silicon oxide film. For example, the high dielectric film may be made of $HfO_2$, HfSiO, HfSiON, HfTaO, HfTiO, HfZrO, zirconium oxide, aluminum oxide, an $HfO_2$—$Al_2O_3$ alloy, or a combination thereof. The dielectric layer 71 may be formed through an atomic layer deposition (ALD) process, a chemical vapor deposition (CVD) process, or a physical vapor deposition (PVD) process. Although not shown, the method may further include forming an interface layer before formation of the dielectric layer 71.

Figure 12A:
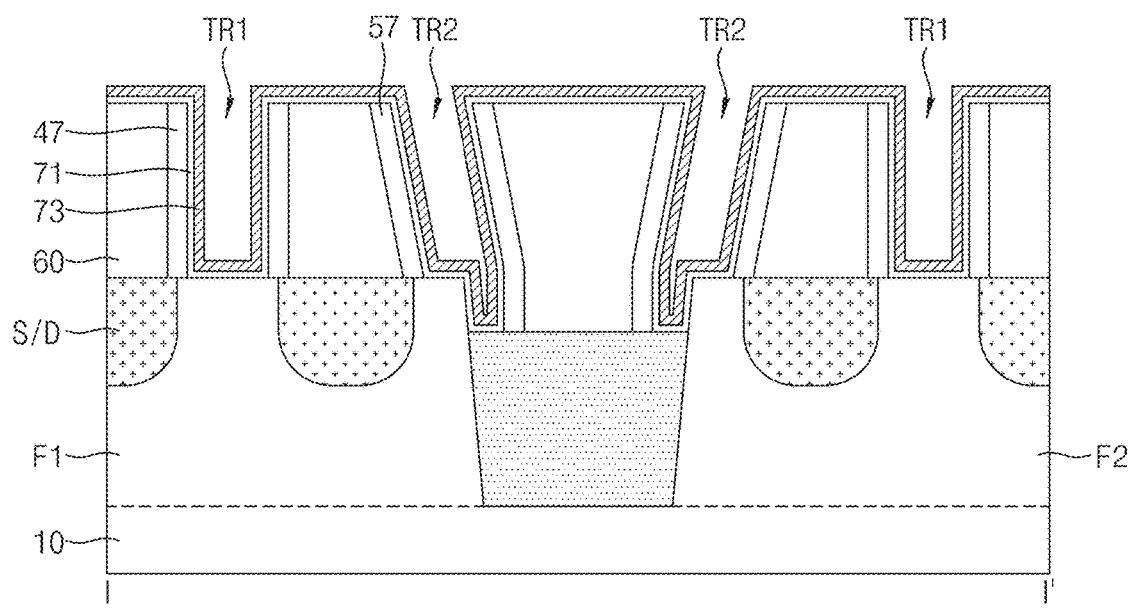
Figure 12B:
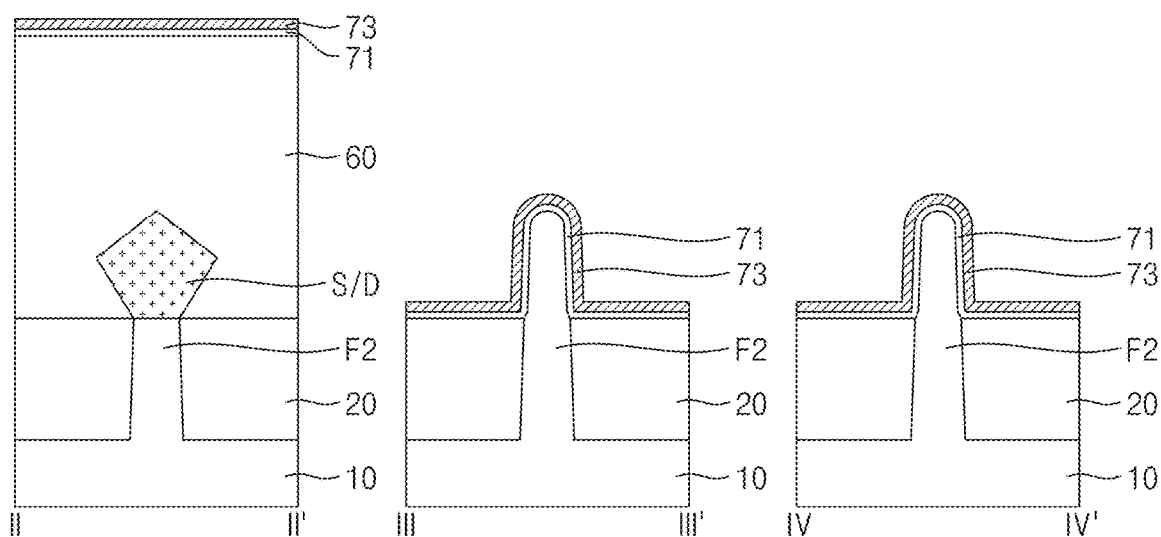

Referring to FIGS. 12A and 12B, the method may include forming a first conductive layer 73 on the dielectric layer 71. The first conductive layer 73 may be formed in the trenches TR1 and TR2, and may incompletely fill the trenches TR1 and TR2. For example, the first conductive layer 73 may include metal nitride, for example, TiN or TaN. The first conductive layer 73 may be formed through an atomic layer deposition (ALD) process, a metal organic ALD (MOALD) process, or a metal organic CVD (MOCVD) process.

Figure 13A:
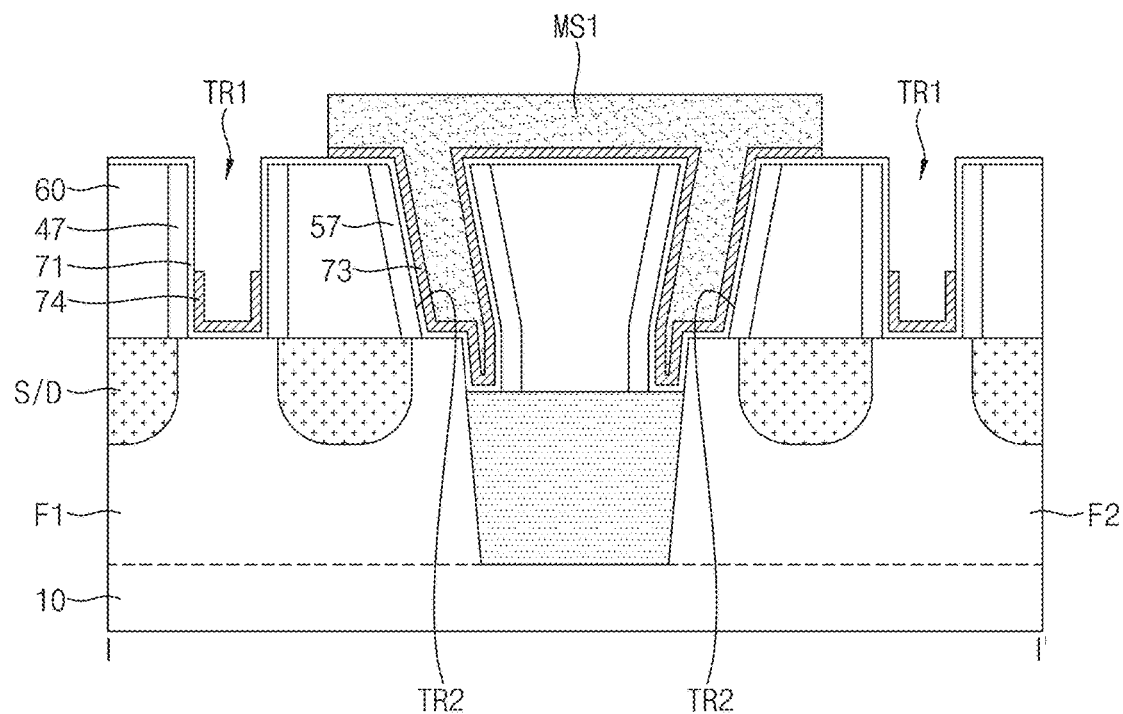
Figure 13B:
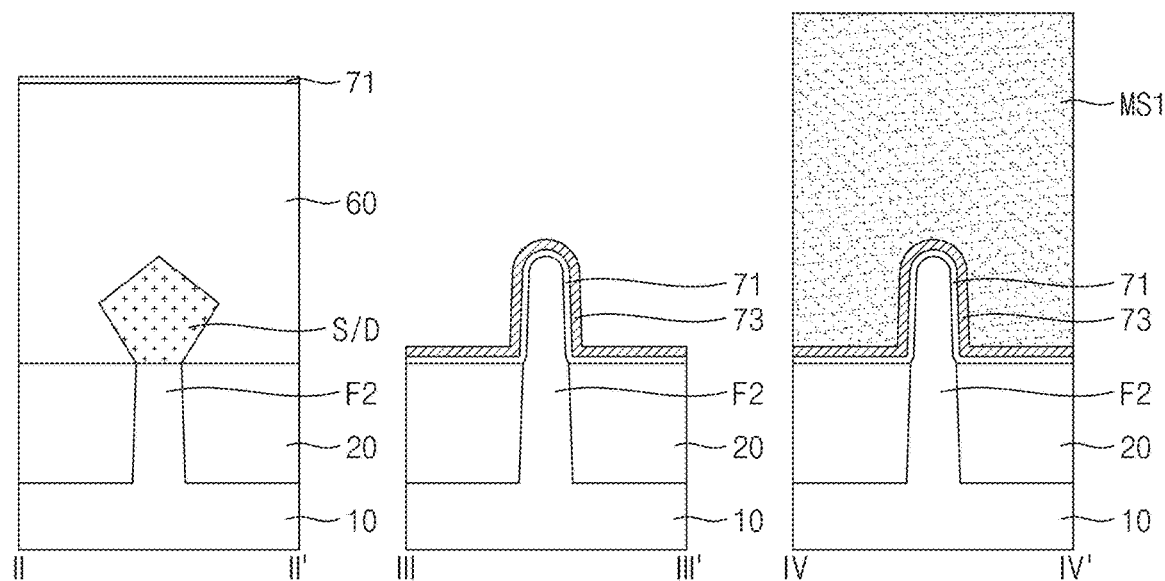

Referring to FIGS. 13A and 13B, the method may include partially removing the first conductive layer 73 from each first trench TR1, thereby forming a first gate electrode 74. Formation of the first gate electrode 74 may include forming a mask layer MS1 completely filling each second trench TR2, and exposing only the first trench TR1. That is, after formation of the mask layer MS1 on the second trench TR2, an etching process may be selectively performed only for the first conductive layer 73 in the first trench TR1. The first conductive layer 73 may remain in the second trench TR2.

Formation of the first gate electrode 74 through partial removal of the first conductive layer 73 may be performing a chamfering process. As an upper portion of the first conductive layer 73 is partially removed through the chamfering process such that only a lower portion of the first conductive layer 73 remains, the first gate electrode 74 may be formed to have a U shape. For example, the chamfering process may include forming a filling material to fill a lower portion of an empty space in the first trench TR1, and selectively etching the first conductive layer 73 using the filling material as a mask. As a result, an upper end of the first gate electrode 74 may be lower than an upper surface of each gate spacer 47. That is, an upper surface of the first conductive layer 73 may be removed until the upper surface of the first conductive layer 73 becomes coplanar with an upper surface of the filling material. Thereafter, the filling material may be selectively removed. After formation of the first gate electrode 74, the mask layer MS1 may be selectively removed such that each second trench TR2 becomes partially empty.

Figure 14A:
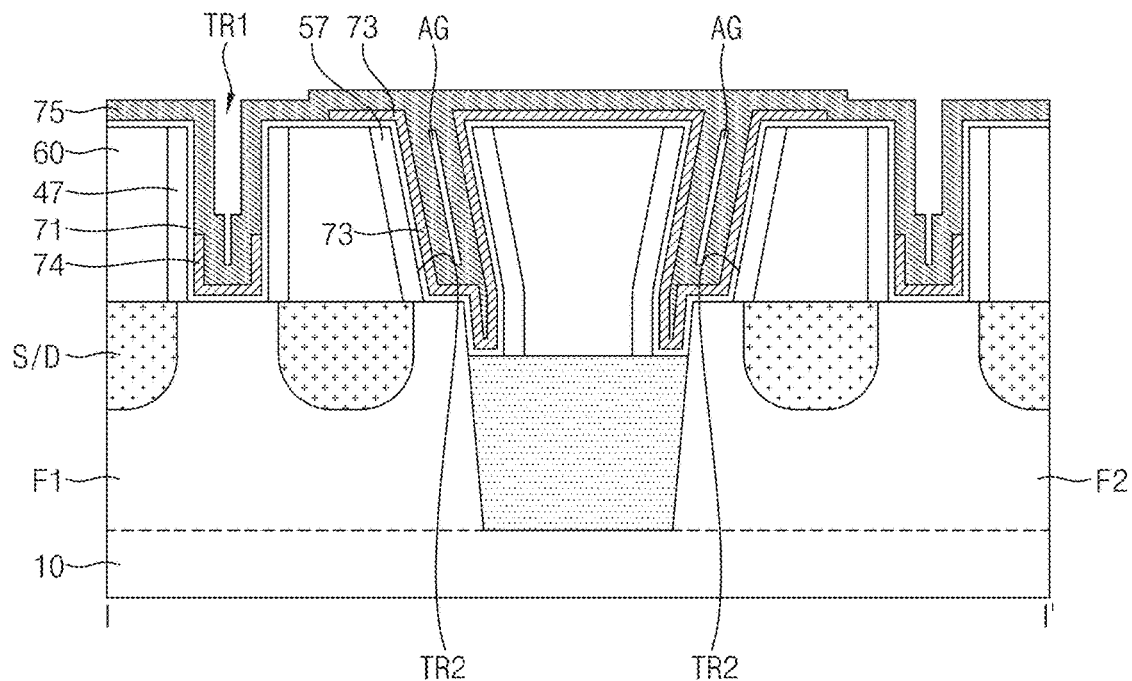
Figure 14B:
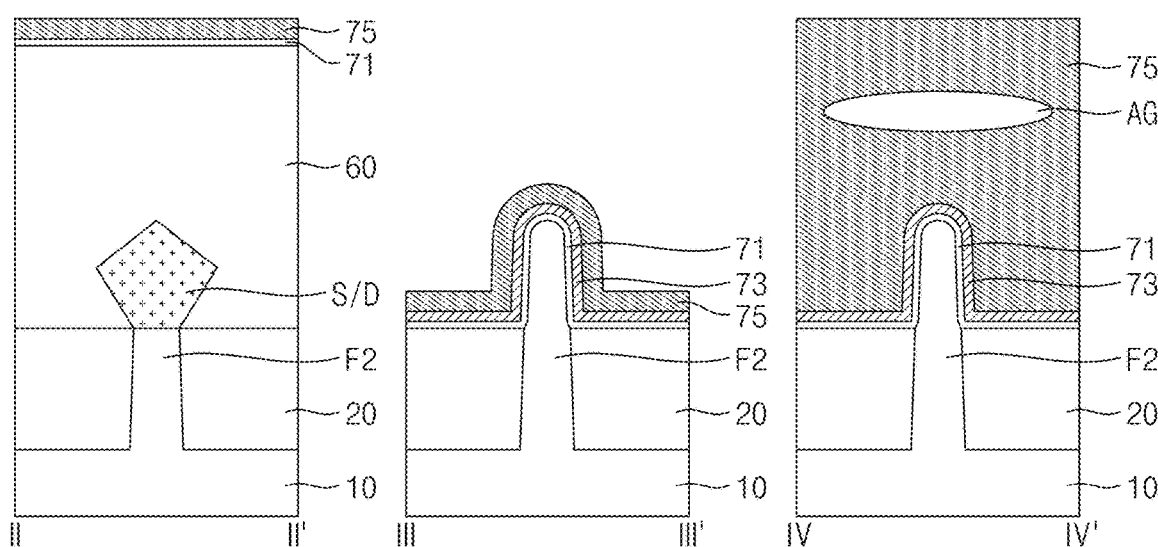

Referring to FIGS. 14A and 14B, the method may include forming a second conductive layer 75 in each first trench TR1 and each second trench TR2. The second conductive layer 75 may be conformally formed while covering the first gate electrode 74 and the dielectric layer 71 in the first trench TR1. The second conductive layer 75 may fill only a portion of the first trench TR1 while completely filling the second trench TR2. Since the first gate electrode 74 formed only at a lower portion of the first trench TR1 is present in the first trench TR1, and the first conductive layer 73 is present in the second trench TR2, an empty space of the first trench TR1 may be greater than an empty space of the second trench TR2. Accordingly, even when the second trench TR2 is completely filled with the second conductive layer 75, the first trench TR1 may be partially filled and, as such, may have a residual space. In some example embodiments, an air gap AG may be formed in the second conductive layer 75 present in the second trench TR2. The second conductive layer 75 may include metal carbide doped with aluminum or silicon. For example, the second conductive layer 75 may include TiAlC, TaAlC, TiSiC, or TaSiC. For example, the second conductive layer 75 may be formed through an atomic layer deposition (ALD) process, a metal organic ALD (MOALD) process, or a metal organic CVD (MOCVD) process.

Figure 15A:
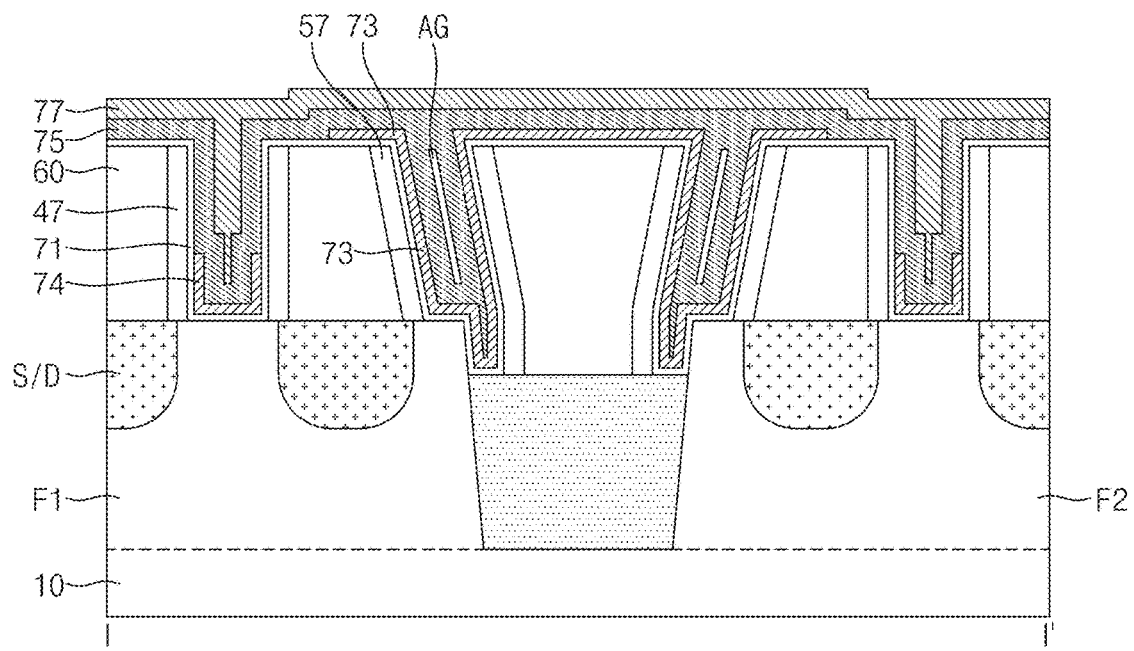
Figure 15B:
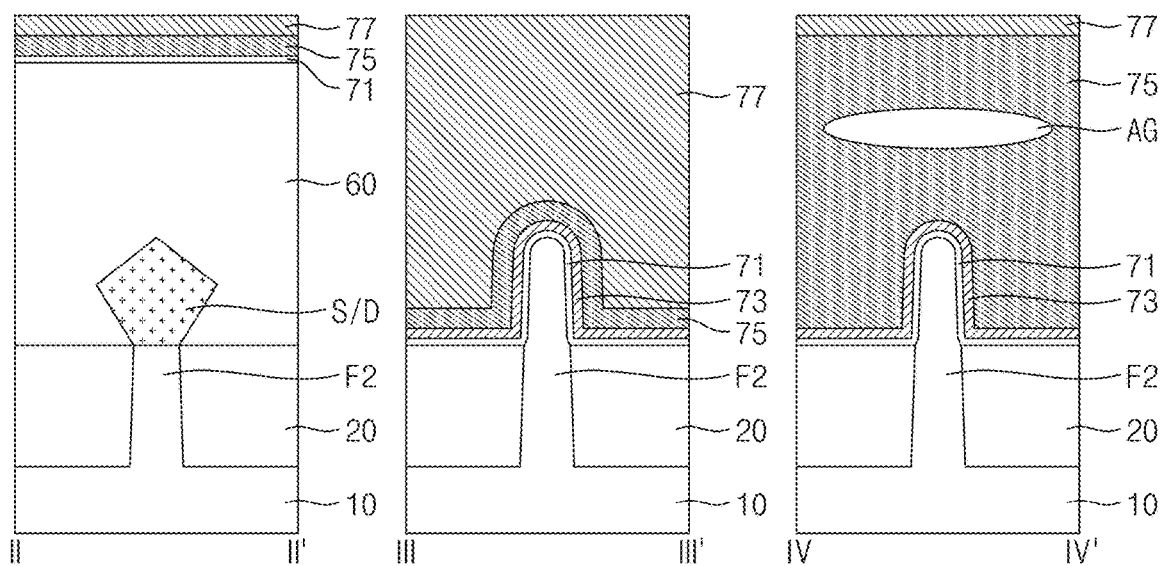

Referring to FIGS. 15A and 15B, the method may include forming a barrier metal layer 77 filling the residual space of the first trench TR1. For example, the barrier metal layer 77 may include a metal nitride such as TiN. For example, the barrier metal layer 77 may be formed through an atomic layer deposition (ALD) process, a metal organic ALD (MOALD) process, or a metal organic CVD (MOCVD) process.

Figure 16A:
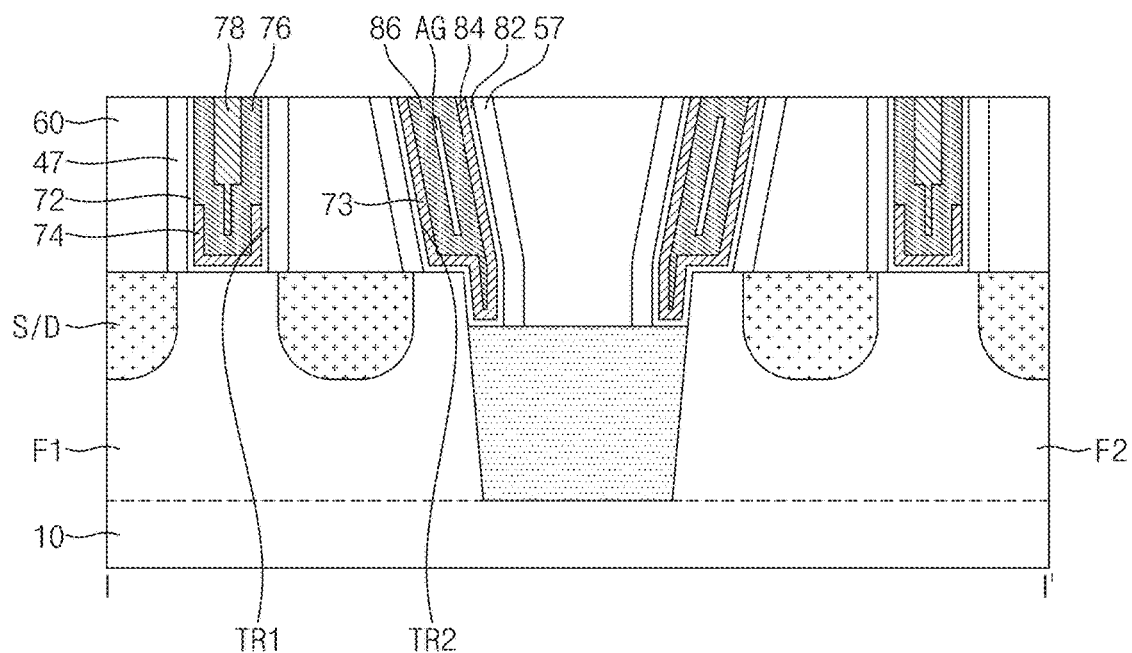
Figure 16B:
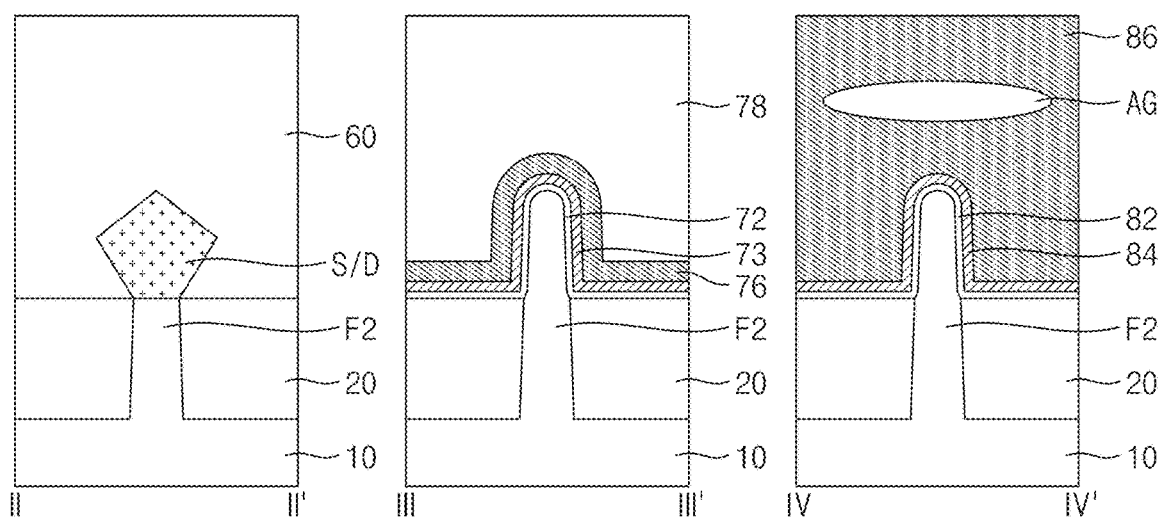

Referring to FIGS. 16A and 16B, the dielectric layer 71, the first conductive layer 73, the second conductive layer 75 and the barrier metal layer 77 may be removed from the resultant structure (for example, FIGS. 15A and 15B) obtained after formation of the barrier metal layer 77, thereby exposing an upper surface of the interlayer insulating layer 60. As a result, a gate dielectric layer 72, a first gate electrode 74, a second gate electrode 76, and a barrier metal pattern 78 may be formed in the first trench TR1. In addition, a dummy gate dielectric layer 82, a first dummy gate electrode 84 and a second dummy gate electrode 86 may be formed in the second trench TR2. The second dummy gate electrode 86 may include an air gap AG.

The dummy gate dielectric layer 82, the first dummy gate electrode 84 and the second dummy gate electrode 86 formed in the second trench TR2 may extend while having an inclination with respect to a direction perpendicular to the main surface of the substrate 10 in accordance with an inclined shape of the second trench T2. Accordingly, upper portions of the dummy gate dielectric layer 82, the first dummy gate electrode 84 and the second dummy gate electrode 86 may be disposed on a corresponding one of the sources/drains S/D. That is, the upper portions of the dummy gate dielectric layer 82, the first dummy gate electrode 84 and the second dummy gate electrode 86 may vertically overlap with the corresponding source/drain S/D.

Figure 17A:
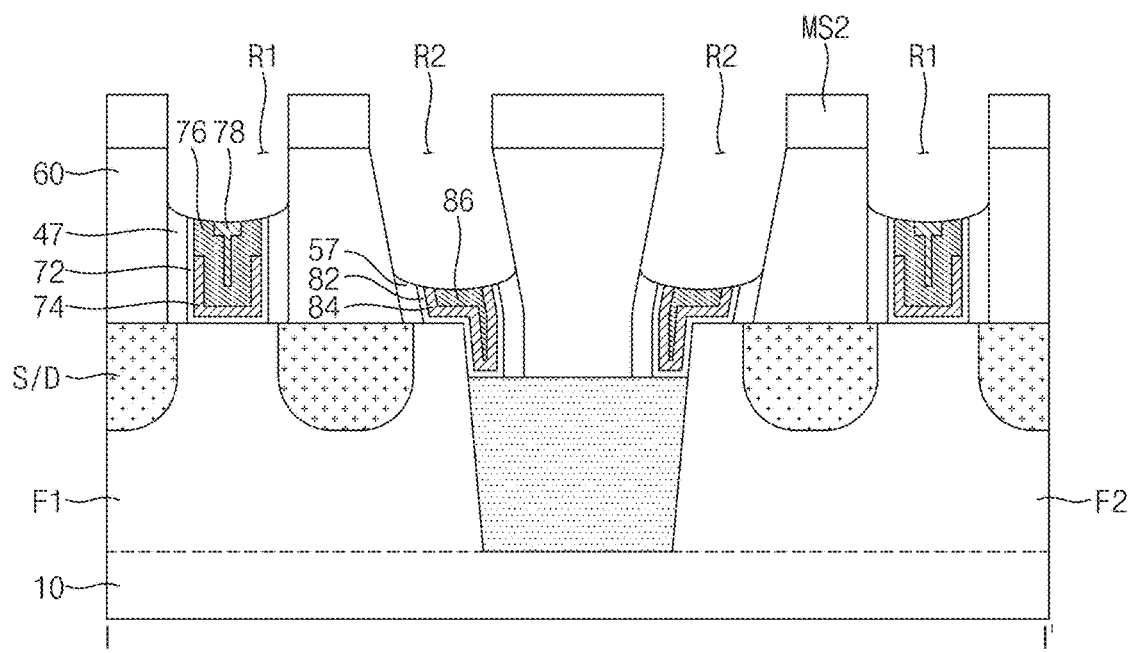
Figure 17B:
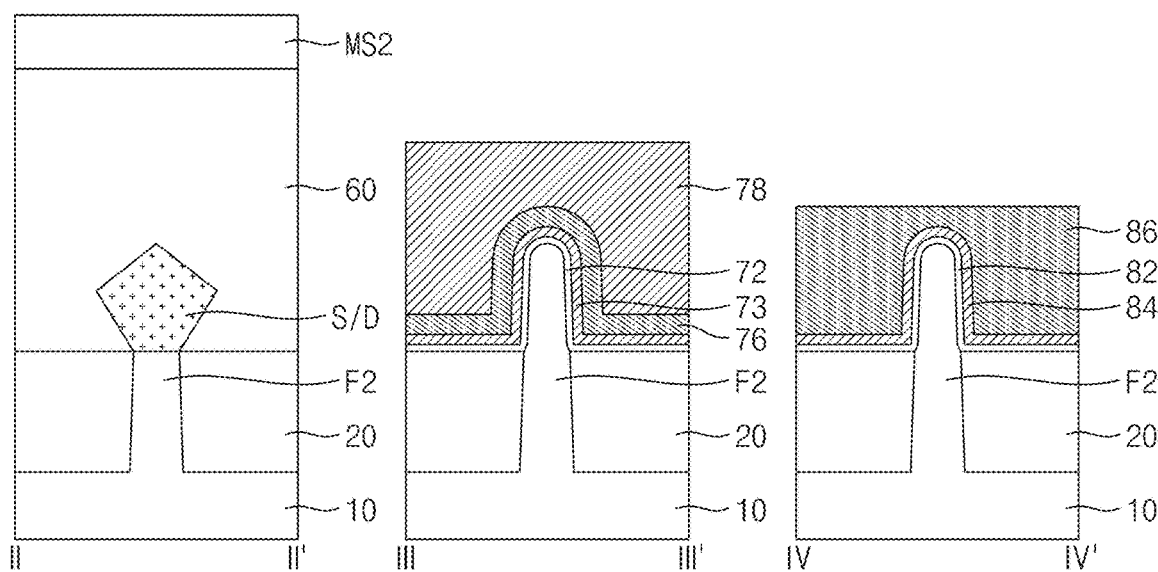

Referring to FIGS. 17A and 17B, the method may include forming recesses R1 and R2. Formation of the recesses R1 and R2 may include forming first recesses R1 and second recesses R2. Each first recess R1 may be formed by forming a mask layer MS2 covering the upper surface of the interlayer insulating layer 60, and etching the gate spacers 47, the gate dielectric layer 72, the first gate electrode 74, the second gate electrode 76 and the barrier metal pattern 78 through an etching process using the mask layer MS2 as an etching mask. In addition, each second recess R2 may be formed by etching the dummy gate spacers 57, the dummy gate dielectric layer 82, the first dummy gate electrode 84 and the second dummy gate electrode 86 through an etching process using the mask layer MS2 as an etching mask. Through the etching process, the first recess R1 and the second recess R2 may be simultaneously formed.

The depth of the first recess R1 and the depth of the second recess R2 may differ from each other. The second recess R2 may be formed to be deeper than the first recess R1. Although the barrier metal pattern 78 may be formed on the second gate electrode 76 between the gate spacers 47 such that the barrier metal pattern 78 completely fills the first trench TR1 (cf. FIG. 16A), the barrier metal pattern 78 is not present between the dummy gate spacers 57, and the second dummy gate electrode 86 completely fills the second trench TR2 (cf. FIG. 16A). Accordingly, in the etching process for formation of the recesses R1 and R2, the rate of lowering a lower surface of the second recess R2 may be faster than the rate of lowering a lower surface of the first recess R1 through execution of an etching process having increased etch selectivity with respect to the second dummy gate electrode 86. In addition, since the air gap AG is formed in the second dummy gate electrode 86, the rate of lowering a lower surface of the second dummy gate electrode 86 may be faster than those of other materials. As a result, the rate of lowering the lower surface of the second recess R2 may be faster than the rate of lowering the lower surface of the first recess R1.

As the second recess R2 is formed to be deeper, heights of the first dummy gate electrode 84 and the second dummy gate electrode 86 may decrease. As a result, upper portions of the dummy gate dielectric layer 82, the first dummy gate electrode 84 and the second dummy gate electrode 86 may be removed and, as such, the dummy gate dielectric layer 82, the first dummy gate electrode 84 and the second dummy gate electrode 86 may not vertically overlap with the corresponding source/drain S/D. Accordingly, even when dummy gate structures are formed to have an inclination, it may be possible to prevent a phenomenon in which contacts connected to the sources/drains S/D are undesirably connected to dummy gate lines.

Figure 18A:
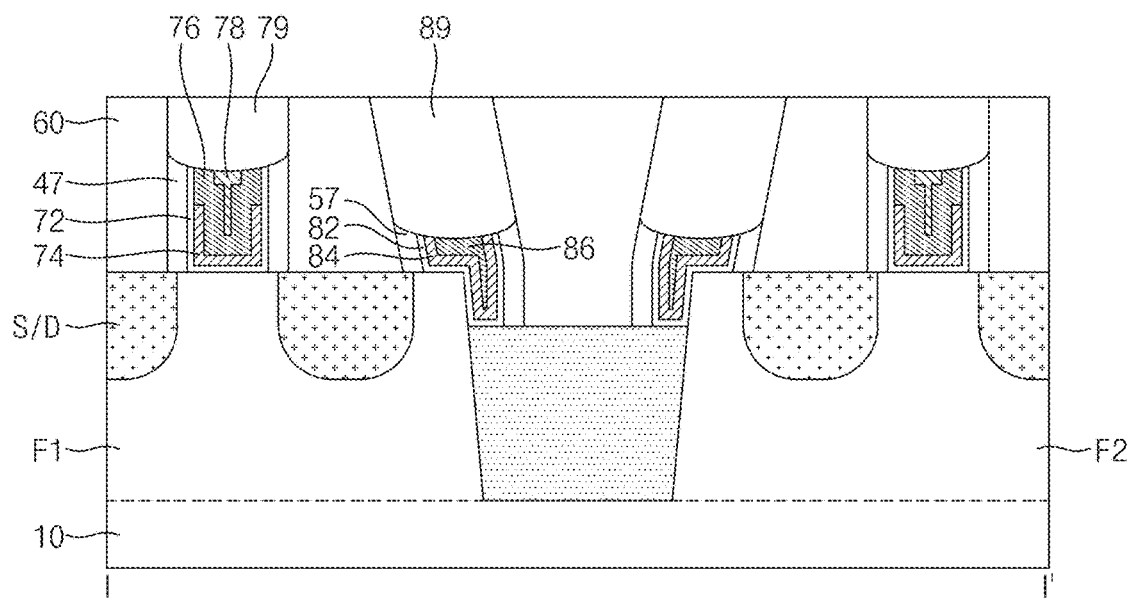
Figure 18B:
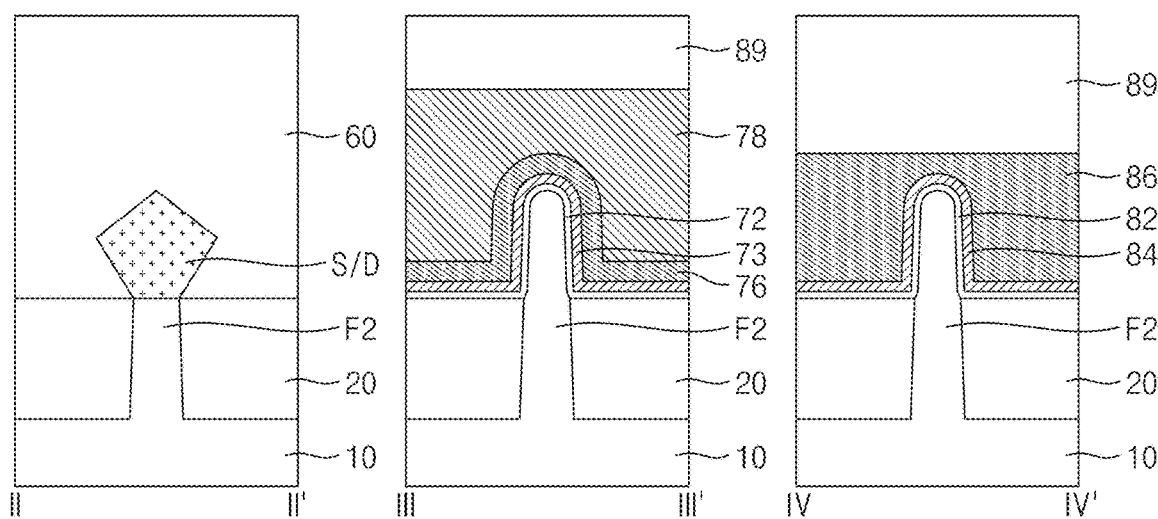

Referring to FIGS. 18A and 18B, the method may include forming a gate capping layer 79 and a dummy gate capping layer 89 in the recesses R1 and R2. The gate capping layer 79 may be formed in each first recess R1, and the dummy gate capping layer 89 may be formed in each second recess R2. Formation of the gate capping layer 79 and the dummy gate capping layer 89 may include depositing an insulating material in the recesses R1 and R2, and performing a planarization process. For example, the gate capping layer 79 and the dummy gate capping layer 89 may include SiN.

In accordance with some example embodiments of the inventive concepts, the height of a gate capping layer included in an inclined gate structure is increased, and the height of a gate line included in the inclined gate structure is decreased. Accordingly, it may be possible to prevent a defective phenomenon such as a phenomenon in which the gate line of the inclined gate structure is undesirably short-circuited with a contact disposed adjacent thereto.

While some example embodiments of the inventive concepts have been described with reference to the accompanying drawings, it should be understood by those skilled in the art that various modifications may be made without departing from the scope of the inventive concepts. Therefore, the above-described example embodiments should be considered in a descriptive sense only and not for purposes of limitation.

What is claimed is:

1. A semiconductor device, comprising:
a first active region and a second active region on a substrate;
an element isolation layer between the first active region and the second active region, an upper surface of the element isolation layer proximate to an upper surface of the substrate in relation to an upper end of the first active region in a vertical direction extending perpendicular to the upper surface of the substrate;
a first dummy gate line including a horizontal section extending at least partially on the first active region to the element isolation layer in a horizontal direction extending parallel to the upper surface of the substrate, and a vertical section extending from the horizontal section and towards the upper surface of the substrate in the vertical direction along a side wall of the first active region, the first dummy gate line having an L shape;
first dummy gate spacers at opposite side walls of the first dummy gate line, respectively; and
a first dummy gate capping layer on both the first dummy gate line and the first dummy gate spacers,
wherein a thickness of the horizontal section in the vertical direction is smaller than a thickness of the vertical section in the vertical direction.

2. The semiconductor device according to claim 1, wherein the first dummy gate capping layer is inclined in one direction.

3. The semiconductor device according to claim 1, wherein the first dummy gate line includes one or more surfaces that at least partially define an air gap that is at least partially within the first dummy gate line.

4. The semiconductor device according to claim 3, wherein the air gap contacts a lower surface of the first dummy gate capping layer.

5. The semiconductor device according to claim 1, wherein the first dummy gate capping layer further includes a protrusion protruding into the first dummy gate line.

6. The semiconductor device according to claim 1, further comprising:
a second dummy gate line on the element isolation layer and the second active region;
second dummy gate spacers at opposite side walls of the second dummy gate line, respectively; and
a second dummy gate capping layer both on the second dummy gate line and the second dummy gate spacers,
wherein the first dummy gate capping layer and the second dummy gate capping layer are inclined in opposite directions away from each other, respectively.

7. A semiconductor device, comprising:
a first active region and a second active region on a substrate;
an element isolation layer between the first active region and the second active region, an upper surface of the element isolation layer proximate to an upper surface of the substrate in relation to an upper end of the second active region in a vertical direction extending perpendicular to the upper surface of the substrate;
a gate structure including a gate line on the first active region, gate spacers at opposite side walls of the gate line, and a gate capping layer on both the gate line and the gate spacers; and
a dummy gate structure including a dummy gate line on both the first active region and the element isolation layer while having an L shape, dummy gate spacers at opposite side walls of the dummy gate line, respectively, and a dummy gate capping layer on both the dummy gate line and the dummy gate spacers,
wherein the dummy gate structure is inclined toward the gate structure, and
wherein a lower surface of the dummy gate capping layer is proximate to the upper surface of the substrate in relation to a lower surface of the gate capping layer in the vertical direction.

8. The semiconductor device according to claim 7, wherein a thickness of the dummy gate line in the vertical direction is smaller than a thickness of the gate line in the vertical direction.

9. The semiconductor device according to claim 7, wherein a thickness of the dummy gate capping layer in the vertical direction is greater than a thickness of the gate capping layer in the vertical direction.

10. The semiconductor device according to claim 7, wherein upper ends of the dummy gate spacers are proximate to the upper surface of the substrate in the vertical direction in relation to upper ends of the gate spacers.

11. The semiconductor device according to claim 7, wherein the gate line comprises:
a first gate electrode having a U shape;
a second gate electrode on the first gate electrode, the second gate electrode including one or more inner surfaces defining a recess at an upper portion of the second gate electrode; and
a barrier metal pattern filling the recess.

12. The semiconductor device according to claim 11, wherein an upper end of the first gate electrode is isolated from direct contact with the gate capping layer in the vertical direction.

13. The semiconductor device according to claim 12, wherein the lower surface of the dummy gate capping layer is proximate to the upper surface of the substrate in the vertical direction in relation to the upper end of the first gate electrode.

14. The semiconductor device according to claim 12, wherein a lower end of the barrier metal pattern is proximate to the upper surface of the substrate in the vertical direction in relation to the upper end of the first gate electrode.

15. The semiconductor device according to claim 14, wherein the lower surface of the dummy gate capping layer is proximate to the upper surface of the substrate in the vertical direction in relation to the lower end of the barrier metal pattern.

16. The semiconductor device according to claim 11, wherein:
the dummy gate line includes
a first dummy gate electrode, and
a second dummy gate electrode on the first dummy gate electrode; and
the dummy gate line does not include any barrier metal pattern.

17. A semiconductor device, comprising:
a first active region and a second active region on a substrate;
an element isolation layer between the first active region and the second active region, an upper surface of the element isolation layer proximate to an upper surface of the substrate in relation to an upper end of the first active region in a vertical direction extending perpendicular to the upper surface of the substrate;
a dummy gate line on both the first active region and the element isolation layer while having an L shape;
a dummy gate spacer including a first spacer at one side wall of the dummy gate line on the first active region, and a second spacer at an opposite side wall of the dummy gate line on the element isolation layer; and
a dummy gate capping layer on both the dummy gate line and the dummy gate spacer,
wherein an upper end of the second spacer is distal to the upper surface of the substrate in relation to an upper end of the first spacer in the vertical direction.

18. The semiconductor device according to claim 17, wherein the dummy gate capping layer comprises:
a first side wall inclined with respect to the vertical direction; and
a second side wall perpendicular to the upper surface of the substrate.

19. The semiconductor device according to claim 18, wherein the second spacer covers the second side wall of the dummy gate capping layer.

20. The semiconductor device according to claim 18, further comprising:
an interlayer insulating layer covering the element isolation layer, the dummy gate spacer, and the dummy gate capping layer,
wherein the second spacer includes an extension interposed between the dummy gate capping layer and the interlayer insulating layer.

* * * * *